(12) United States Patent
Gu et al.

(10) Patent No.: US 12,082,415 B2
(45) Date of Patent: Sep. 3, 2024

(54) SEMICONDUCTOR DEVICES AND DATA STORAGE SYSTEM INCLUDING THE SAME

(71) Applicant: Samsung Electronics Co., Ltd., Suwon-si (KR)

(72) Inventors: Jimo Gu, Seoul (KR); Bumkyu Kang, Suwon-si (KR); Sungmin Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 17/375,273

(22) Filed: Jul. 14, 2021

(65) Prior Publication Data

US 2022/0149072 A1 May 12, 2022

(30) Foreign Application Priority Data

Nov. 9, 2020 (KR) .................. 10-2020-0148648

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 80/00; H10B 41/27; H10B 43/27; H01L 25/0657; H01L 29/0649; H01L 29/0653; H01L 21/76224–76235
See application file for complete search history.

(56) References Cited

U.S. PATENT DOCUMENTS

| 7,847,342 | B2 | 12/2010 | Fukuzumi et al. |
| 8,013,389 | B2 * | 9/2011 | Oh .......................... H10B 43/27 257/E21.663 |
| 8,766,446 | B2 | 7/2014 | Kuge et al. |
| 9,437,609 | B2 | 9/2016 | Huo et al. |
| 9,543,319 | B1 * | 1/2017 | Wu ......................... H10B 43/27 |
| 10,068,914 | B2 | 9/2018 | Jiang et al. |

(Continued)

FOREIGN PATENT DOCUMENTS

| CN | 109411480 A | 3/2019 | |
| CN | 110310958 A * | 10/2019 | ............ H01L 27/115 |
| KR | 10-2020-0032872 A | 3/2020 | |

*Primary Examiner* — Ali Naraghi
*Assistant Examiner* — E. Rhett Cheek
(74) *Attorney, Agent, or Firm* — Harness, Dickey & Pierce, P.L.C.

(57) ABSTRACT

A semiconductor device includes a substrate, a lower stack structure on the substrate and including lower gate electrodes stacked apart from each other, an upper stack structure on the lower stack structure and including upper gate electrodes stacked apart from each other, a lower channel structure penetrating through the lower stack structure and including a lower channel layer, and a lower channel insulating layer on the lower channel layer the lower channel insulating layer surrounding a lower slit, and an upper channel structure penetrating through the upper stack structure and including an upper channel layer and an upper channel insulating layer on the upper channel layer, the upper channel insulating layer surrounding an upper slit. A width of the lower slit is greater than a width of the upper slit, and a thickness of the lower channel insulating layer is greater than a thickness of the upper channel insulating layer.

20 Claims, 22 Drawing Sheets

(56) References Cited

U.S. PATENT DOCUMENTS

| | | |
|---|---|---|
| 10,325,924 B2 | 6/2019 | Ko et al. |
| 2009/0146206 A1* | 6/2009 | Fukuzumi ............... H10B 43/20 |
| | | 257/E21.442 |
| 2010/0109065 A1* | 5/2010 | Oh ....................... H01L 27/0688 |
| | | 257/314 |
| 2018/0175050 A1* | 6/2018 | Son ........................ H10B 43/35 |
| 2018/0308859 A1* | 10/2018 | Choi ................... H01L 29/7827 |
| 2019/0252402 A1* | 8/2019 | Lee ................... H01L 21/02238 |
| 2019/0371809 A1 | 12/2019 | Yun et al. |
| 2020/0091185 A1 | 3/2020 | Baek |
| 2020/0135755 A1* | 4/2020 | Shin ....................... H10B 43/27 |
| 2021/0225866 A1* | 7/2021 | Lu .......................... H10B 43/10 |
| 2022/0068948 A1* | 3/2022 | Ito .......................... H10B 43/50 |

\* cited by examiner

SEMICONDUCTOR DEVICES AND DATA STORAGE SYSTEM INCLUDING THE SAME

CROSS-REFERENCE TO RELATED APPLICATION(S)

This application claims the benefit under 35 USC 119(a) of Korean Patent Application No. 10-2020-0148648 filed on Nov. 9, 2020 in the Korean Intellectual Property Office, the entire disclosure of which is incorporated herein by reference for all purposes.

BACKGROUND

Some example embodiments relate to a semiconductor device and/or a data storage system including the same.

In data storage systems requiring data storage, semiconductor devices capable of storing high-capacity data are used. Accordingly, a method of increasing the data storage capacity of a semiconductor device is being studied. For example, as a method for increasing a data storage capacity of a semiconductor device, a semiconductor device including memory cells arranged three-dimensionally instead of two-dimensionally, is proposed.

SUMMARY

Some example embodiments provide a semiconductor device having improved reliability.

Alternatively or additionally, some example embodiments provide a data storage system including a semiconductor device having improved reliability.

According to some example embodiments, a semiconductor device includes a substrate, a lower stack structure on the substrate, and including lower gate electrodes stacked apart from each other, an upper stack structure on the lower stack structure and including upper gate electrodes stacked apart from each other, a lower channel structure penetrating through the lower stack structure, and including a lower channel layer and a lower channel insulating layer on the lower channel layer, the lower channel insulating layer surrounding a lower slit, and an upper channel structure penetrating through the upper stack structure and including an upper channel layer and an upper channel insulating layer on the upper channel layer, the upper channel insulating layer surrounding an upper slit. The lower channel structure includes a first channel structure, a second channel structure on the first channel structure, and a bent portion between the first channel structure and the second channel structure, a bend in the bent structure corresponding to a difference in widths between the first and second channel structures, a width of a lower portion of the upper channel structure is less than a width of an upper portion of the lower channel structure, and a width of the lower slit is greater than a width of the upper slit.

According to some example embodiments, a semiconductor device includes a substrate, a lower stack structure on the substrate and including lower gate electrodes stacked apart from each other, an upper stack structure on the lower stack structure and including upper gate electrodes stacked apart from each other, a lower channel structure penetrating through the lower stack structure and including a lower channel layer, and a lower channel insulating layer on the lower channel layer, the lower channel insulating layer surrounding a lower slit, and an upper channel structure penetrating through the upper stack structure and including an upper channel layer, and an upper channel insulating layer disposed on the upper channel layer, the upper channel insulating layer surrounding an upper slit. A width of the lower slit is greater than a width of the upper slit, and a thickness of the lower channel insulating layer is greater than a thickness of the upper channel insulating layer.

According to some example embodiments, a data storage system includes a semiconductor storage device including a base substrate; active or passive circuits on the base substrate; a substrate on the active or passive circuits; a lower stack structure on the substrate and including lower gate electrodes stacked apart from each other; an upper stack structure on the lower stack structure and including upper gate electrodes stacked apart from each other; a lower channel structure penetrating through the lower stack structure and including a lower channel layer and a lower channel insulating layer on the lower channel layer, the lower channel insulating layer surrounding a lower slit; and an upper channel structure penetrating through the upper stack structure and including an upper channel layer and an upper channel insulating layer disposed on the upper channel layer, the upper channel insulating layer surrounding an upper slit, the semiconductor storage device including an input/output pad electrically connected to the at least one of the active or passive circuits, and a controller circuitry electrically connected to the semiconductor storage device through the input/output pad and configured to control the semiconductor storage device. A width of the lower slit is greater than a width of the upper slit, and a thickness of the lower channel insulating layer is greater than a thickness of the upper channel insulating layer.

BRIEF DESCRIPTION OF DRAWINGS

The above and other aspects, features, and advantages of example embodiments will be more clearly understood from the following detailed description, taken in conjunction with the accompanying drawings, in which.

DETAILED DESCRIPTION OF SOME EXAMPLE EMBODIMENTS

Hereinafter, some example embodiments will be described with reference to the accompanying drawings.

Figure 1:
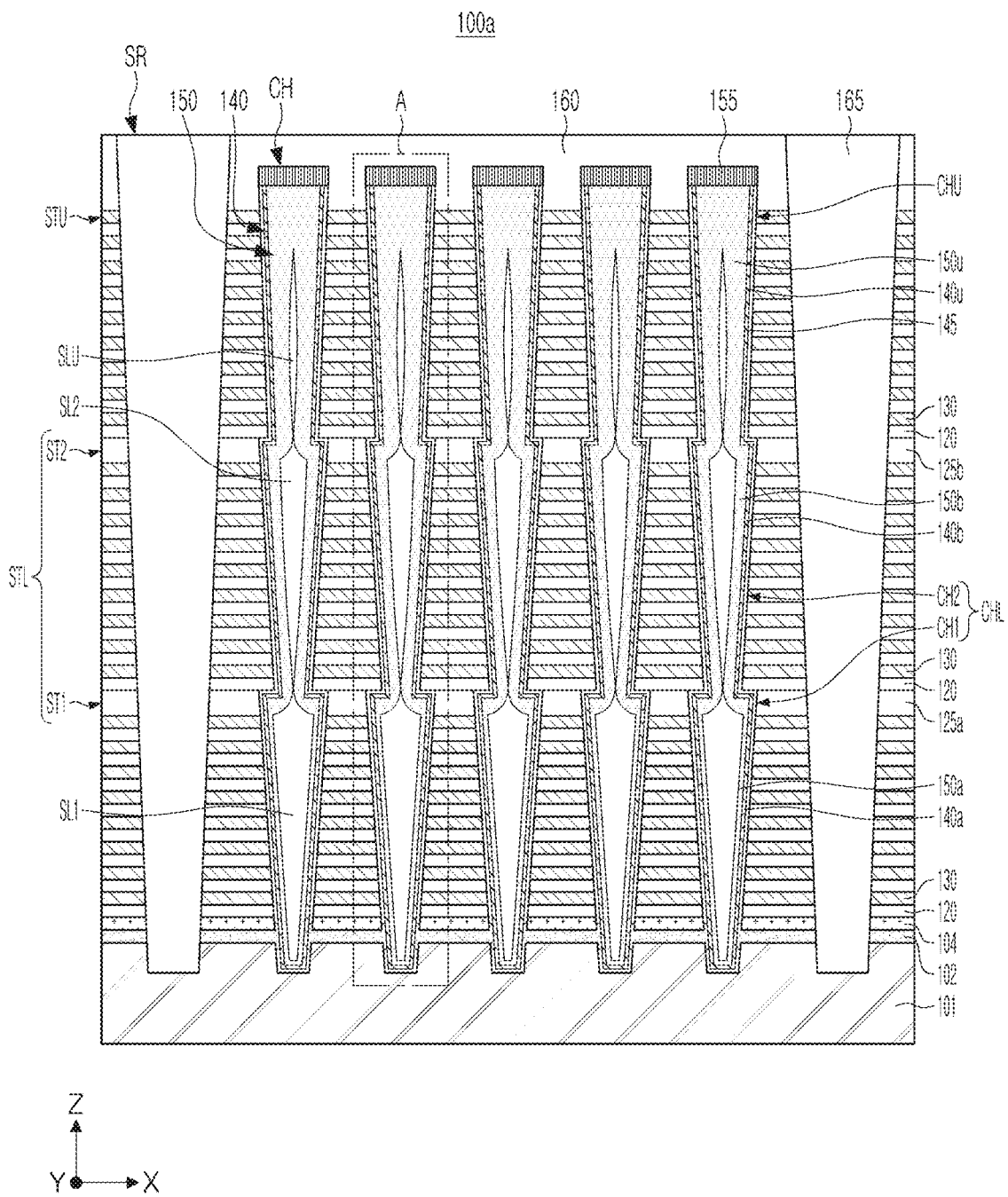
FIG. 1 is a schematic cross-sectional view of a semiconductor device according to some example embodiments.
Figure 2:
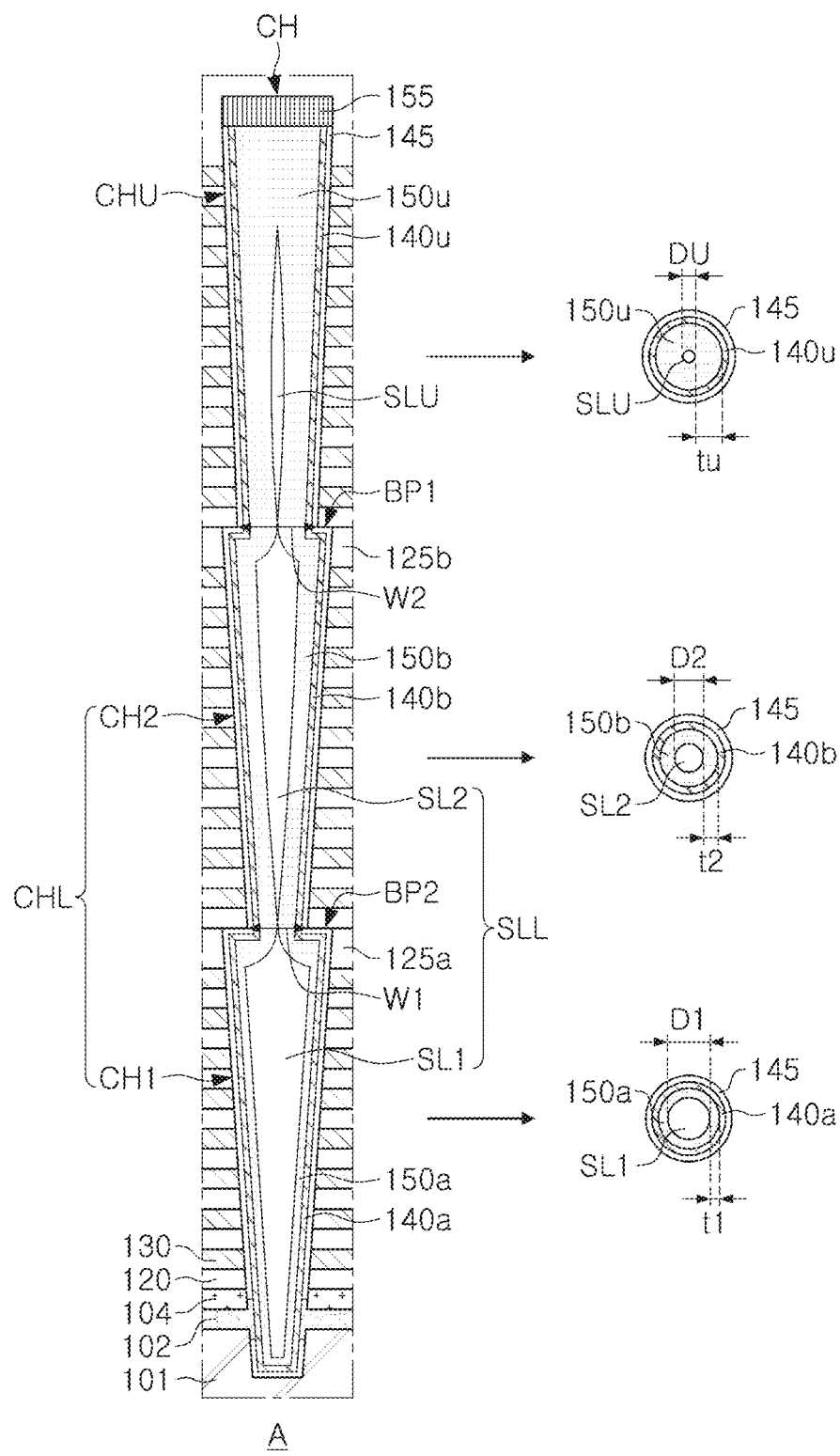
FIG. 2 illustrates a schematic enlarged cross-sectional view and a plan view of a channel structure of a semiconductor device according to some example embodiments.

FIG. 1 is a schematic cross-sectional view of a semiconductor device according to some example embodiments. FIG. 2 illustrates a schematic enlarged cross-sectional view and a plan view of a channel structure of a semiconductor device according to some example embodiments. FIG. 2 is an enlarged schematic cross-sectional view of area A of the channel structure in FIG. 1.

Referring to FIGS. 1 and 2, a semiconductor device 100a may include a substrate 101, a lower stack structure STL disposed on the substrate 101 and including lower gate electrodes 130 stacked to be spaced apart from each other, an upper stack structure (STU) disposed on the lower stack structure STL and including upper gate electrodes 130, a lower channel structure CHL penetrating through the lower stack structure STL, an upper channel structure CHU penetrating through the upper stack structure, and a separation structure SR. In some example embodiments, the semiconductor device 100a may further include a first horizontal conductive layer 102 and a second horizontal conductive layer 104 between the substrate 101 and the lower stack structure STL. In some example embodiments, the lower stack structure STL may include a first stack structure ST1 and a second stack structure ST2 disposed on the first stack structure ST1.

The substrate 101 may have an upper surface extending in the X and Y directions. The substrate 101 may be or include a semiconductor material, such as a group IV semiconductor, a group III-V compound semiconductor, or a group II-VI compound semiconductor. For example, the group IV semiconductor may include silicon, germanium, or silicon-germanium. The substrate 101 may further include impurities, e.g. may be lightly doped with impurities such as boron. The substrate 101 may be provided as an epitaxial layer or a polycrystalline semiconductor layer such as a polycrystalline silicon layer, or may be a single-crystal silicon layer formed, for example, with a Czochralski process.

The first and second horizontal conductive layers 102 and 104 may be stacked and disposed on the upper surface of the substrate 101. At least a portion of the first and second horizontal conductive layers 102 and 104 may function as a portion of a common source line of the semiconductor device 100a. For example, the first and second horizontal conductive layers 102 and 104 may function as a common source line together with the substrate 101. The first horizontal conductive layer 102 may be connected, e.g. directly connected to the channel layer 140, around the channel layer 140. The first and second horizontal conductive layers 102 and 104 may include a semiconductor material, for example, polycrystalline silicon. In some example embodiments, at least the first horizontal conductive layer 102 may be a doped layer, and the second horizontal conductive layer 104 may be a doped layer, and/or a layer containing impurities diffused from the first horizontal conductive layer 102. According to some example embodiments, the second horizontal conductive layer 104 may be replaced with an insulating layer.

Each of the lower stack structure STL and the upper stack structure STU may include gate electrodes 130 disposed to be spaced apart from each other, and interlayer insulating layers 120 alternately disposed with the gate electrodes 130.

The gate electrodes 130 may be vertically spaced apart and stacked on the substrate 101 to constitute the stack structures STL and STU. The gate electrodes 130 may include a lower gate electrode forming a gate of a ground select transistor, memory gate electrodes forming a plurality of memory cells, and upper gate electrodes forming gates of string select transistors. The number of memory gate electrodes constituting memory cells may be determined according to the capacity of the semiconductor device 100a, and may or may not be a power of two (2). Depending on example embodiments, the upper and lower gate electrodes may be one or two or more, respectively, and may have the same structure as or a structure different from that of the memory gate electrodes. In some example embodiments, the gate electrodes 130 may further include a gate electrode 130 disposed on the upper gate electrodes and/or below the lower gate electrode and constituting/corresponding to an erasing transistor used in an erasing operation using a gate induced drain leakage (GIDL) phenomenon. Also, some of the gate electrodes 130, for example, memory gate electrodes adjacent to the upper or lower gate electrode, may be dummy gate electrodes, e.g. gate electrodes that support fabrication of and/or mechanical stability of, other gate electrodes.

The gate electrodes 130 may include a metallic material such as tungsten (W). Depending on example embodiments, the gate electrodes 130 may include polycrystalline silicon and/or a metal silicide material. In some example embodiments, the gate electrodes 130 may further include a diffusion barrier. For example, the diffusion barrier may include tungsten nitride (WN), tantalum nitride (TaN), titanium nitride (TiN), or combinations thereof.

Interlayer insulating layers 120 may be disposed between the gate electrodes 130. Similarly to the gate electrodes 130, the interlayer insulating layers 120 may be spaced apart from each other in a direction perpendicular to the upper surface of the substrate 101 and may be disposed to extend in the X direction. The interlayer insulating layers 120 may include an insulating material such as silicon oxide and/or silicon nitride. A thickness of each of the interlayer insulating layers 120 may be more than, equal to, substantially equal to, or less than a thickness of each of the gate electrodes 130.

First and second intermediate insulating layers 125a and 125b may include, e.g. may be, the same material as the interlayer insulating layers 120, for example, an insulating material such as silicon oxide or silicon nitride. The first and second intermediate insulating layers 125a and 125b may be formed to have a thickness greater than that of the interlayer insulating layers 120 in the first stack structure ST1 and the second stack structure ST2, respectively.

Each of the channel structures CH forms/corresponds to one memory cell string, and may be disposed to be spaced apart from each other while forming a row and a column. The channel structures CH have a columnar shape, and may have at least one inclined side surface narrowing closer to the substrate 101, according to an aspect ratio. For example the channel structures CH may have portions that are tapered.

The channel structure CH may include a lower channel structure CHL and an upper channel structure CHU.

The upper channel structure CHU may be disposed on a higher level than the lower channel structure CHL, e.g. may be further from a top surface of the substrate 101. The upper channel structure CHU may be disposed on the lower channel structure CHL. Since the width of a lower portion of the upper channel structure CHU is less than the width of an upper portion of the lower channel structure CHL, the channel structure CH may include a first bent portion BP1, due to or resulting from or having a bend based on a difference in widths between the upper channel structure CHU and the lower channel structure CHL, as illustrated in FIG. 2. The first bent portion BP1 may be disposed adjacent to the second intermediate insulating layer 125*b*. In some example embodiments, a lowermost end of the lower channel structure CHL may be disposed on a level lower than the upper surface of the substrate 101. In some example embodiments, the lowermost end of the lower channel structure CHL may be disposed in a recessed area of the substrate 101.

The lower channel structure CHL may include a first channel structure CH1 and a second channel structure CH2 disposed on the first channel structure CH1. The first channel structure CH1 may be disposed on a level lower than that of the second channel structure CH2. A number of alternating layers of the gate electrodes 130 and the interlayer insulating layers 120 in the first channel structure CH1 may be the same, or may be different, than the number of alternating layers of the gate electrodes 130 and the interlayer insulating layers 120 in the second channel structure CH2. Since the width of the lower portion of the second channel structure CH2 is less than the width of the upper portion of the first channel structure CH1, the lower channel structure CHL may include a second bent portion BP2 due to a difference in widths between the first channel structure CH1 and the second channel structures CH2 as illustrated in FIG. 2. The second bent portion BP2 may be disposed adjacent to the first intermediate insulating layer 125*a*.

In FIGS. 1 and 2, the channel structure CH is illustrated as having a three-stage structure having two bent portions, but the number of bent portions of the channel structure CH may be variously changed to be one, or two more, depending on the number of stages of the stack structures STL and STU.

In some example embodiments, a first or minimum width W2 of the upper channel structure CHU may be greater than a second or minimum width W1 of the second channel structure CH2, but is not limited thereto.

Each of the lower channel structure CHL and the upper channel structure CHU may include a channel layer 140, a channel insulating layer 150 on the channel layer, and slits SLL and SLU disposed inside of the channel insulating layer 150. The slits SLL and SLU may be defined by the surrounding channel insulating layer 150. In addition, each of the lower channel structure CHL and the upper channel structure CHU may further include a gate dielectric layer 145 disposed between the gate electrodes 130 and the channel layer 140. The lower channel structure CHL includes a lower gate dielectric layer, and the upper channel structure CHU includes an upper gate dielectric layer.

The channel layer 140 may be disposed inside of the channel structure CH. The channel layer 140 may include lower channel layers 140*a* and 140*b* penetrating through the lower stack structure STL, and an upper channel layer 140*u* penetrating through the upper stack structure STU. The upper channel layer 140*u* may refer to a channel layer disposed on a level higher than (e.g. further from an upper surface of the substrate 101 than) the lower channel layers 140*a* and 140*b*, and the upper channel layer 140*u* and the lower channel layers 140*a* and 140*b* may be connected to each other. The lower channel layers 140*a* and 140*b* may include a first lower channel layer 140*a* disposed in the first channel structure CH1 and a second lower channel layer 140*b* disposed in the second channel structure CH2. The first lower channel layer 140*a* and the second lower channel layer 140*b* may be connected (e.g. directly connected) to each other.

In the channel structures CH, the channel layer 140 may be formed in an annular shape surrounding the channel insulating layer 150. A lower portion of the channel layer 140 may be connected to the first horizontal conductive layer 102. The channel layer 140 may include a semiconductor material such as polycrystalline silicon and/or single crystal silicon, and may be doped or may be undoped.

The channel insulating layer 150 may include lower channel insulating layers 150*a* and 150*b* penetrating through the lower stack structure STL, and an upper channel insulating layer 150*u* penetrating through the upper stack structure STU. The upper channel insulating layer 150*u* may be disposed on the upper channel layer 140*u*, and the lower channel insulating layers 150*a* and 150*b* may be disposed on the lower channel layers 140*a* and 140*b*. The upper channel insulating layer 150*u* may be disposed on a level higher than (e.g. further from an upper surface of the substrate 101 than) the lower channel insulating layers 150*a* and 150*b*. The channel insulating layer 150 may be an insulating material. The lower channel insulating layers 150*a* and 150*b* may include a first lower channel insulating layer 150*a* disposed on the first lower channel layer 140*a*, and a second lower channel insulating layer 150*b* disposed on the second lower channel layer 140*b*. The second lower channel insulating layer 150*b* may be disposed on a level higher than (e.g. further from an upper surface of the substrate 101 than) the first lower channel insulating layer 150*a*.

The channel insulating layer 150 may be formed by depositing, e.g. conformally depositing, along the inner surface of the channel layer 140. At least a portion of the channel insulating layer 150 may have an annular shape including an empty space inside of the channel insulating layer 150. At least portions of the channel insulating layer 150 disposed in a region adjacent to the second intermediate insulating layer 125*b* may be deposited along the inner side of the channel layer 140 to contact each other. In some example embodiments, at least a portion of the channel insulating layer 150 may be disposed to fill the interior of the channel layer 140 such that there is no empty space in the center of the channel structure CH in a region thereof adjacent to the second intermediate insulating layer 125*b*. For example, the channel insulating layer 150 may kiss/bread loaf profile inside the center of the channel structure CH. The center of the channel structure CH may be pinched by the channel insulating layer 150.

At least a portion of the upper channel insulating layer 150*u* may have an annular shape including an empty space inside of the upper channel insulating layer 150*u*. The empty space may be the upper slit SLU. At least a portion of the upper channel insulating layer 150*u* may surround the upper slit SLU. At least portions of the channel insulating layer 150 disposed between the upper slit SLU and the second lower slit SL2 may be deposited along the inner surface of the channel layer 140, to contact each other. In some example embodiments, a lower portion of the upper channel insulating layer 150u may fill the interior of the channel layer 140 such that there is no empty space in the center of the channel structure CH. In some example embodiments, the upper channel insulating layer 150u may fill the interior of the channel layer 140 such that there is no empty space in the center of the channel structure CH in a region adjacent to the lower channel insulating layers 150a and 150b.

The lower channel insulating layers 150a and 150b may include a first lower channel insulating layer 150a disposed inside of the first channel structure CH1, and a second lower channel insulating layer 150b disposed inside of the second channel structure CH2. At least a portion of the lower channel insulating layers 150a and 150b may have an annular shape including an empty space inside of the lower channel insulating layers 150a and 150b. The lower channel insulating layers 150a and 150b may surround and/or may define the lower slit SLL. In some example embodiments, at least portions of the channel insulating layer 150 disposed between the second lower slit SL2 and the first lower slit SL1 may be deposited along the inner side of the channel layer 140 to contact each other. In some example embodiments, at least portions of the lower channel insulating layers 150a and 150b may fill the interior of the channel layer 140 in regions adjacent to the first intermediate insulating layer 125a such that there is no empty space in the center of the channel structure CH. In some example embodiments, the lower portion of the second lower channel insulating layer 150b may fill the interior of the channel layer 140 such that there is no empty space in the center of the channel structure CH. In some example embodiments, at least a portion of the second lower channel insulating layer 150b may fill the interior of the channel layer 140 in a region adjacent to the first intermediate insulating layer 125a such that there is no empty space in the center of the channel structure CH.

The thickness of the channel insulating layer 150 may be increased toward the top of the channel structure CH. For example, the thickness of the channel insulating layer 150 may increase as the distance from the substrate 101 increases. A thickness tu of the upper channel insulating layer 150u may be greater than either of, or the sum of, thicknesses t1 and t2 of the lower channel insulating layers 150a and 150b. In some example embodiments, the thickness tu of the upper channel insulating layer 150u may be greater than the thickness t2 of the second lower channel insulating layer 150b, and may be greater than the thickness t1 of the first lower channel insulating layer 150a. Alternatively or additionally, in some example embodiments, the thickness t2 of the second lower channel insulating layer 150b may be greater than the thickness t1 of the first lower channel insulating layer 150a. In some example embodiments, the thickness of the upper channel insulating layer 150u and the thicknesses of the lower channel insulating layers 150a and 150b may indicate each average thickness or the largest thickness.

The slits SLU and SLL may be empty spaces and/or air gaps disposed inside of the channel insulating layer 150. The slits SLU and SLL may include the lower slit SLL surrounded by the lower channel insulating layers 150a and 150b, and the upper slit SLU surrounded by the upper channel insulating layer 150u. The upper slit SLU may be disposed on a higher level than the lower slit SLL. In some example embodiments, the lower slits SL1 and SL2 may include a first lower slit SL1 surrounded by the first lower channel insulating layer 150a and a second lower slit SL2 surrounded by the second lower channel insulating layer 150b. The second lower slit SL2 may be disposed on a higher level than the first lower slit SL1. In some example embodiments, the width of the lower slit SLL and the width of the upper slit SLU may indicate each an average width or a maximum width.

The upper slit SLU may be disposed to be spaced apart from the lower slit SLL. For example, the upper slit SLU and the lower slit SLL may not be connected, e.g. may be isolated from each other. The upper channel insulating layer 150u may be disposed between the upper slit SLU and the lower slit SLL. The upper slit SLU may have lower and upper portions and a side surface surrounded by the upper channel insulating layer 150u. Since the upper slit SLU is not connected to the lower slit SLL, in a subsequent process after the channel insulating layer 150 is formed, process gas and/or the like may be prevented from, or reduced in likelihood of, penetrating to the lower portion of the channel structure CH.

In some example embodiments, the upper slit SLU may be disposed to be spaced apart from the second lower slit SL2, and the first lower slit SL1 may be disposed to be spaced apart from the second lower slit SL2. For example, the upper slit SLU and the second lower slit SL2 may not be connected, and the second lower slit SL2 and the first lower slit SL1 may not be connected. The upper channel insulating layer 150u may be disposed between the upper slit SLU and the second lower slit SL2. The second lower channel insulating layer 150b may be disposed between the second lower slit SL2 and the first lower slit SL1. The lower and upper portions and a side surface of the first lower slit SL1 may be surrounded by the first lower channel insulating layer 150a. The lower and upper portions and a side surface of the first lower slit SL1 may be in contact with or in direct contact with the first lower channel insulating layer 150a. The lower, upper, and side surfaces of the second lower slit SL2 may be surrounded by the second lower channel insulating layer 150b. The lower, upper, and side surfaces of the second lower slit SL2 may be in contact with or in direct contact with the second lower channel insulating layer 150b.

Either or both of widths D1 and D2 of the lower slit SLL may be greater than a width DU of the upper slit SLU. The volume of or defined by or surrounded by the lower slit SLL may be greater than the volume of the upper slit SLU. In some example embodiments, the width D1 of the first lower slit SL1 may be greater than the width D2 of the second lower slit SL2, and the width D2 of the second lower slit SL2 may be greater than the width DU of the upper slit SLU. In some example embodiments, the volume of the first lower slit SL1 may be greater than the volume of the second lower slit SL2, and the volume of the second lower slit SL2 may be greater than the volume of the upper slit SLU.

Since the thickness of the channel insulating layer 150 is reduced toward the bottom of the channel structure CH, a width of a slit disposed on a relatively low level may be greater than that of a slit disposed at a relatively high level. Since the separation structure SR has a shape narrowing as the separation structure approaches the substrate 101, the volume of the gate electrodes 130 disposed on a relatively low level may be greater than the volume of the gate electrodes 130 disposed at a relatively high level. Accordingly, the tensile stress may be relieved by forming the channel insulating layer 150 to be thinner toward the bottom. As the thickness of the channel insulating layer 150 becomes thinner, tensile stress is relieved to reduce warpage of the semiconductor device 100a.

In some example embodiments, when a width such as the minimum width W2 of the upper channel structure CHU is greater than a width such as the minimum width W1 of the second channel structure CH2, the channel insulating layer 150 may be formed, in such a manner that the first lower slit SL1 and the second lower slit SL2 are spaced apart from each other, by adjusting step coverage to uniformly deposit the channel insulating layer 150. In the deposition operation of the channel insulating layer 150 described below with reference to FIG. 14D, upper portions of the first lower channel insulating layer 150a contact prior to upper portions of the second lower channel insulating layer 150b such that there is no empty space inside of the channel layer 140, thereby forming the first lower slit SL1. Thus, the thickness t1 of the first lower channel insulating layer 150a may be less than the thickness t2 of the second lower channel insulating layer 150b and/or the width to of the upper channel insulating layer 150u disposed on a relatively high level.

The gate dielectric layer 145 may be disposed between the gate electrodes 130 and the channel layer 140. The gate dielectric layer 145 includes a lower gate dielectric layer and an upper gate dielectric layer. The lower gate dielectric layer and the upper gate dielectric layer are connected to (e.g. contiguous with) each other. The lower gate dielectric layer is disposed between the lower gate electrodes 130 and the lower channel layer CHL. The upper gate dielectric layer disposed between the upper gate electrodes 130 and the upper channel layer CHU. Although not necessarily illustrated, the gate dielectric layer 145 may include each of or at least one of a tunneling layer, a charge storage layer, and a blocking layer sequentially stacked from the channel layer 140. The tunneling layer may tunnel charge to the charge storage layer, and may include, for example, silicon oxide ($SiO_2$), silicon nitride ($Si_3N_4$), silicon oxynitride (SiON), or combinations thereof. The charge storage layer may be a charge trapping layer and/or a floating gate conductive layer. The blocking layer may include silicon oxide ($SiO_2$), silicon nitride ($Si_3N_4$), silicon oxynitride (SiON), a high-k dielectric material, or combinations thereof. In some example embodiments, at least a portion of the gate dielectric layer 145 may extend in a horizontal direction along the gate electrodes 130.

The channel pad 155 may be disposed on an upper end of the channel structure CH. The channel pads 155 may be disposed to cover the upper surface of the channel insulating layer 150 and be electrically connected to the channel layer 140. The channel pads 155 may include, for example, doped polycrystalline silicon.

Referring to FIG. 1, the separation structure SR may be disposed to penetrate through the gate electrodes 130 and to extend in the X direction. The separation structure SR may penetrate through the entirety of the gate electrodes 130 stacked on the substrate 101, to be connected to the substrate 101.

The separation structure SR may include an isolation insulating layer 165. The isolation insulating layer 165 may have a shape in which the width thereof is reduced toward the substrate 101 due to a high aspect ratio. In some example embodiments, the separation structure SR may further include a conductive layer between the isolation insulating layers 165. In some example embodiments, the conductive layer may function as a common source line of the semiconductor device 100a and/or a contact plug connected to the common source line.

A cell region insulating layer 160 may be disposed on the upper stack structure STU of the gate electrodes 130 and may include an insulating material such as silicon oxide and/or silicon nitride.

In some embodiments, only the components described with reference to FIGS. 1 and 2 and modified components will be described. Descriptions of components that are the same as or similar to those described with reference to FIGS. 1 and 2 may be equally applied.

Figure 3:
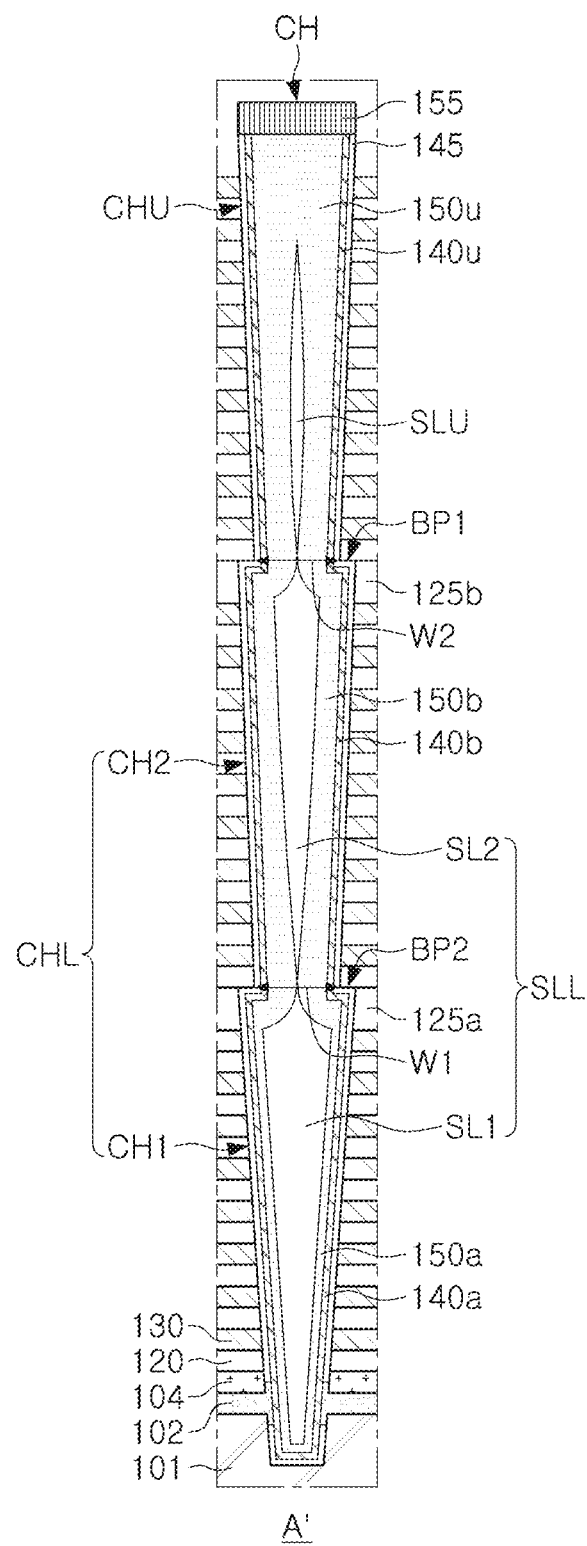
FIG. 3 is a schematic enlarged cross-sectional view of a channel structure of a semiconductor device according to some example embodiments.

FIG. 3 is a schematic enlarged cross-sectional view of a channel structure of a semiconductor device according to some example embodiments. FIG. 3 is a schematic cross-sectional view of a channel structure in an area A' corresponding to the area A of FIG. 1. The area A' illustrates the shape of a channel structure modified in the area A of FIG. 1.

Referring to FIG. 3, unlike the channel structure CH illustrated in FIG. 2, in a channel structure CH of FIG. 3, a first/minimum width W2 of the upper channel structure CHU may be substantially the same as a second/minimum width W1 of the second channel structure CH2.

In some example embodiments, when the minimum width W2 of the upper channel structure CHU is formed to be substantially the same as the minimum width W1 of the second channel structure CH2, the channel insulating layer 150 may be formed such that the first lower slit SL1 and the second lower slit SL2 are spaced apart from each other, by adjusting step coverage and depositing the channel insulating layer 150.

Figure 4:
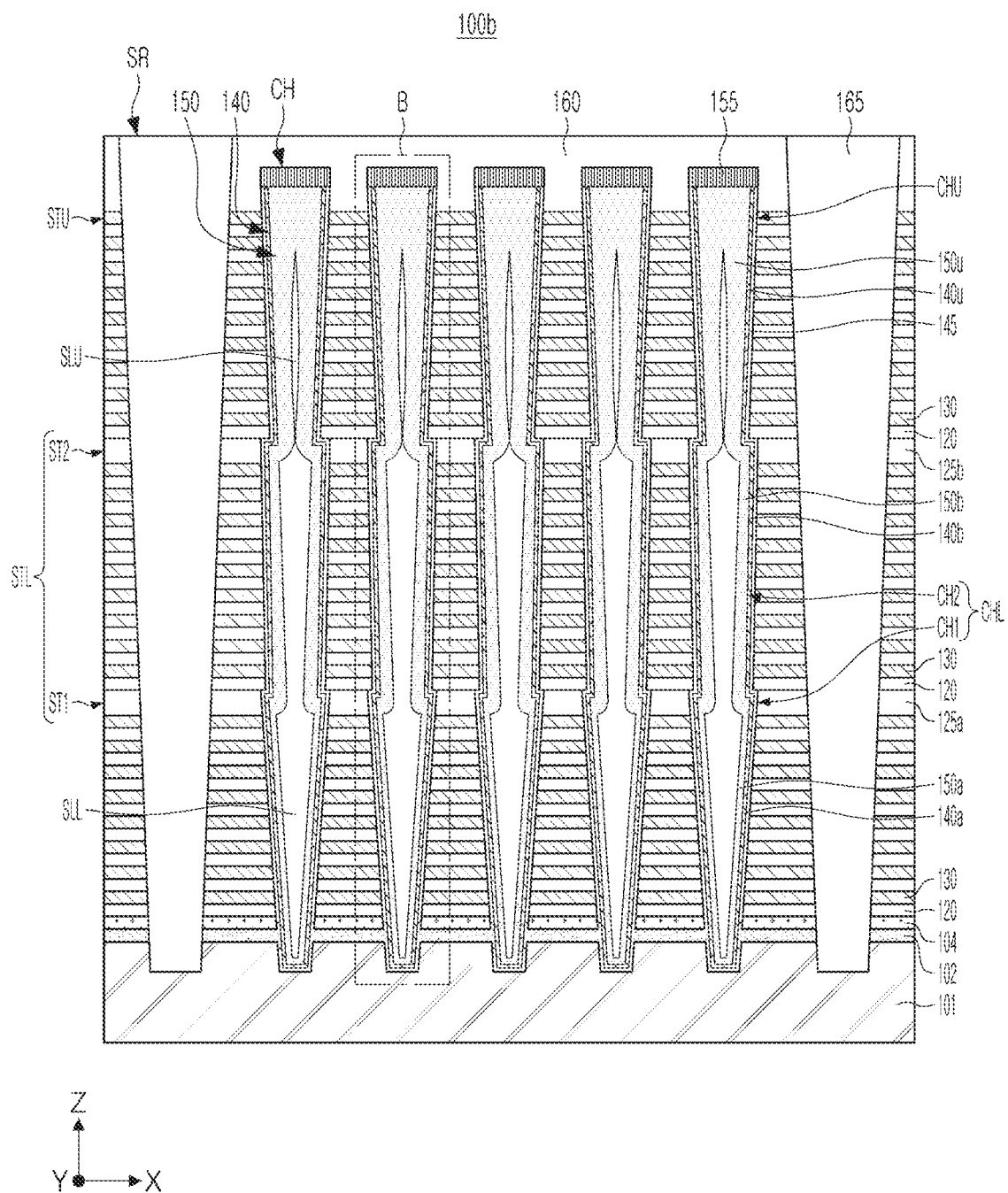
FIG. 4 is a schematic cross-sectional view of a semiconductor device according to some example embodiments.
Figure 5:
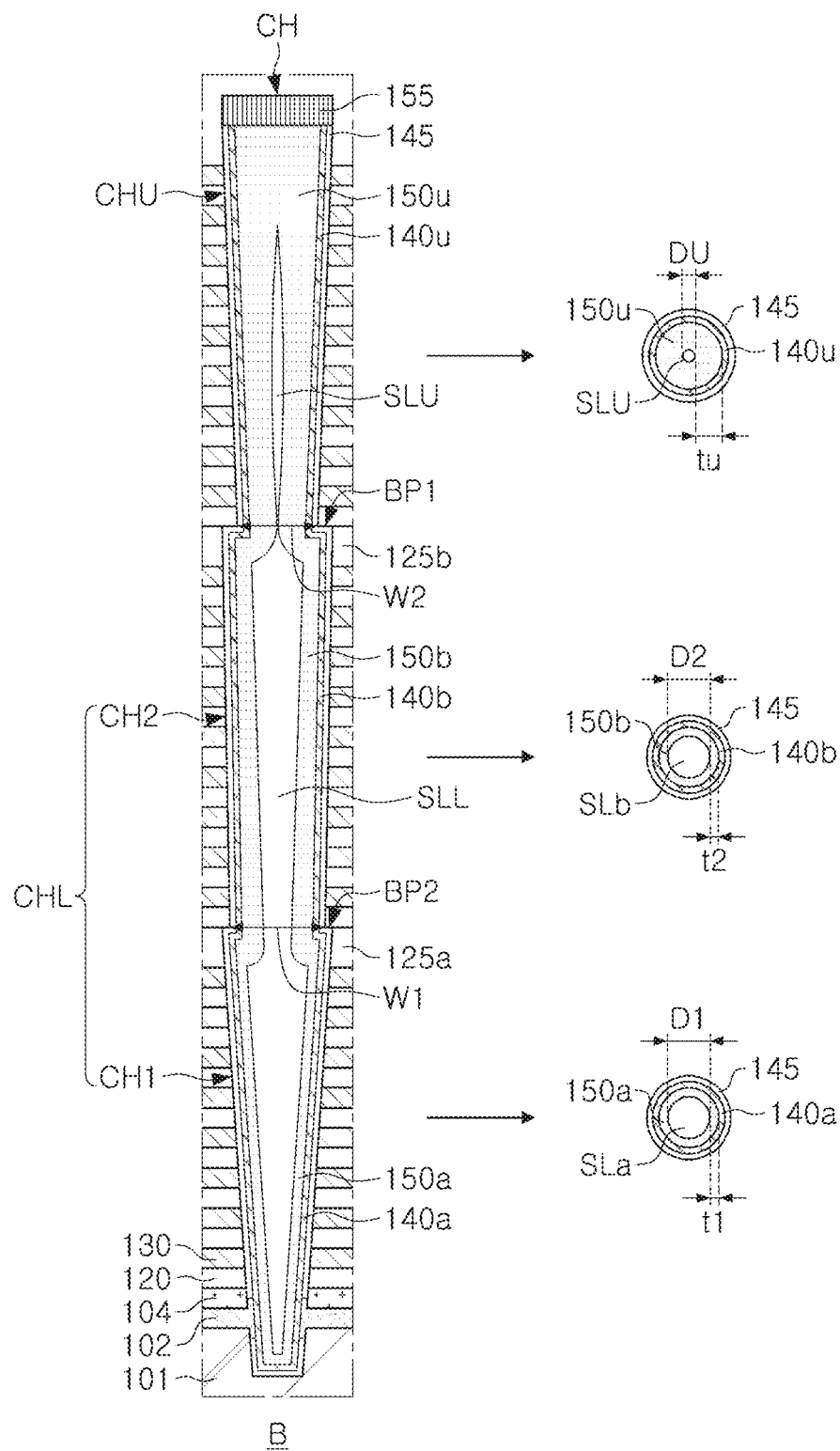
FIG. 5 is a schematic enlarged cross-sectional view and a plan view of a channel structure of a semiconductor device according to some example embodiments.

FIG. 4 is a schematic cross-sectional view of a semiconductor device according to some example embodiments. FIG. 5 is a schematic enlarged cross-sectional view and a plan view of a channel structure of a semiconductor device according to some example embodiments. FIG. 5 is an enlarged schematic cross-sectional view of area B of the channel structure in FIG. 4.

Referring to FIGS. 4 and 5, in a semiconductor device 100b, a lower slit SLL of the channel structure CH may be an empty space connected as one. Unlike the lower slit SLL described with reference to FIGS. 1 and 2, the lower slit SLL of some example embodiments may not include an empty space of which the lower and upper portions and the side surface are surrounded by the first lower channel insulating layer 150a, and an empty space of which the lower and upper portions and the side surface are surrounded by the second lower channel insulating layer 150b. The lower slit SLL may be surrounded by the lower channel insulating layers 150a and 150b. The lower and upper portions and the side surface of the lower slit SLL may be surrounded by the lower channel insulating layers 150a and 150b. The lower and upper portions and the side surface of the lower slit SLL may be in contact with the lower channel insulating layers 150a and 150b. The lower slit SLL may extend from the first channel structure CH1 to the interior of the second channel structure CH2 and may be disposed to be connected between the first channel structure CH1 and the second channel structure CH2.

The upper end of the first lower channel insulating layer 150a may not fill the inside of the channel layer 140 without an empty space. The lower end of the second lower channel insulating layer 150b may not fill the inside of the channel layer 140 without an empty space. For example, in the z direction of a region where the first lower channel insulating layer 150a and the second lower channel insulating layer 150b are connected, the lower channel insulating layers 150a and 150b may surround the lower slit SLL.

A thickness tu of the upper channel insulating layer 150u may be greater than either or both of thicknesses t1 and t2 of the lower channel insulating layers 150a and 150b. The thickness t1 of the first lower channel insulating layer 150a and the thickness t2 of the second lower channel insulating layer 150b may be substantially the same, or the thickness t2 of the second lower channel insulating layer 150b may be greater than the thickness of the first lower channel insulating layer 150a.

In some example embodiments, a minimum width W2 of the upper channel structure CHU may be less than a minimum width W1 of the second channel structure CH2. In some example embodiments, the channel insulating layer 150 may be uniformly deposited by adjusting the step coverage, such that the lower slit SLL is connected as one, and the channel insulating layer 150 may be formed in such a manner that an upper slit SLU and a lower slit SLL are spaced apart from each other. In the deposition operation of the channel insulating layer 150 described with reference to FIG. 14D, when the minimum width W2 of the upper channel structure CHU is less than the minimum width W1 of the second channel structure CH2, since upper portions of the second lower channel insulating layer 150b contacts earlier than the first lower channel insulating layer 150a, to form the lower slit SLL, the thicknesses t1 and t2 of the lower channel insulating layers 150a and 150b may be less than the thickness tu of the upper channel insulating layer 150u disposed on a relatively high level.

The widths D1 and D2 of the lower slit SLL may be greater than the width DU of the upper slit SLU. The volume of the lower slit SLL may be greater than the volume of the upper slit SLU. In some example embodiments, in the connected lower slit SLL, the width D1 of a third lower slit SLa disposed at a relatively low level may be substantially the same as the width D2 of a fourth lower slit SLb disposed at the relatively high level or may be greater than the width D2 of the fourth lower slit SLb, and the width D2 of the fourth lower slit SLb may be greater than the width DU of the upper slit SLU. In some example embodiments, the volume of the third lower slit SLa may be substantially the same as the volume of the fourth lower slit SLb or may be greater than the volume of the fourth lower slit SLb, and the volume of the fourth lower slit SLb may be greater than the volume of the upper slit SLU.

In some example embodiments, the minimum width W2 of the upper channel structure CHU may be substantially the same as the minimum width W1 of the second channel structure CH2. In some example embodiments, the channel insulating layer 150 is non-uniformly deposited by adjusting step coverage, such that the lower slit SLL is connected as one, and the channel insulating layer 150 may be formed in such a manner that an upper slit SLU and a lower slit SLL are spaced apart from each other.

Figure 6:
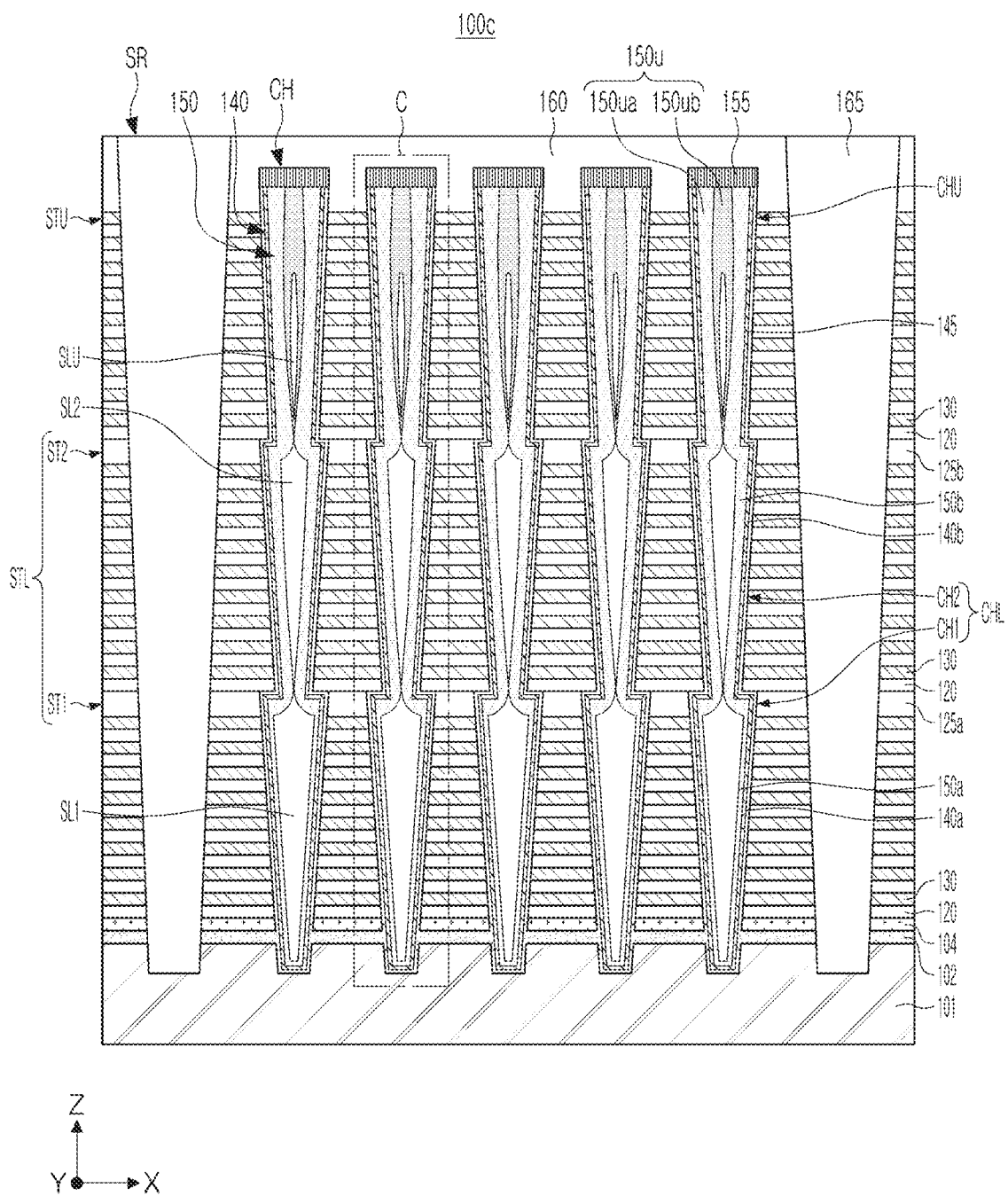
FIG. 6 is a schematic cross-sectional view of a semiconductor device according to some example embodiments.

FIG. 6 is a schematic cross-sectional view of a semiconductor device according to some example embodiments.

Figure 7:
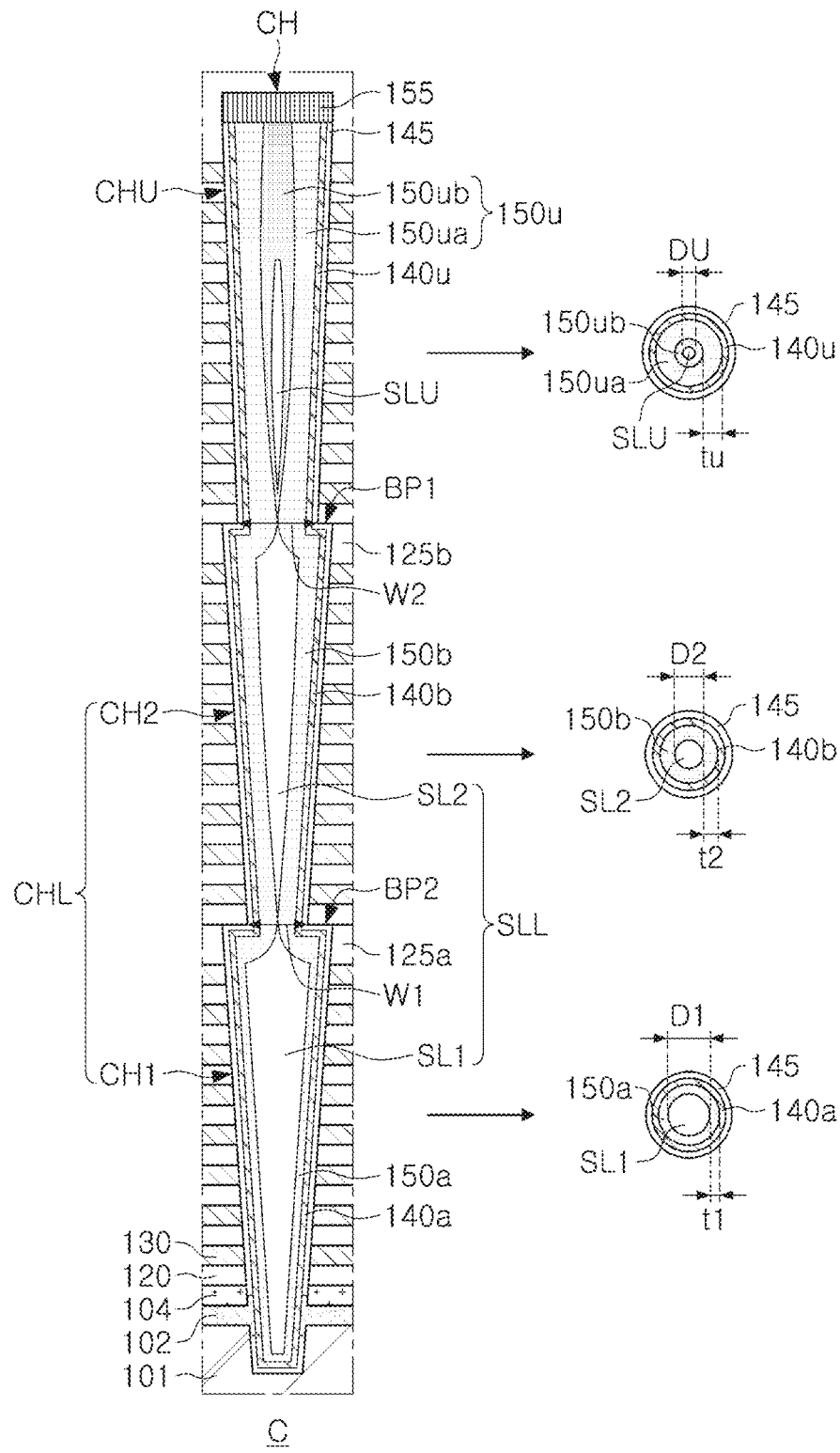
FIG. 7 is a schematic enlarged cross-sectional view and a plan view of a channel structure of a semiconductor device according to some example embodiments.

FIG. 7 is a schematic enlarged cross-sectional view and a plan view of a channel structure of a semiconductor device according to some example embodiments. FIG. 7 is a schematic cross-sectional view of the channel structure by enlarging area C of FIG. 6.

Referring to FIGS. 6 and 7, in a semiconductor device 100c, an upper channel insulating layer 150u may include a first upper channel insulating layer 150ua and a second upper channel insulating layer 150ub sequentially stacked on an upper channel layer 140u.

The first upper channel insulating layer 150ua may be disposed on a upper channel layer 140u, and the second upper channel insulating layer 150ub may be disposed on a first upper channel insulating layer 150ua. The first upper channel insulating layer 150ua may surround the second upper channel insulating layer 150ub. The first upper channel insulating layer 150ua may be disposed between the upper channel layer 140u and the second upper channel insulating layer 150ub. An empty space and/or an air gap may be formed inside of the second upper channel insulating layer 150ub. The second upper channel insulating layer 150ub may surround the upper slit SLU. The second upper channel insulating layer 150ub may be contact with the upper slit SLU.

In some example embodiments, the first upper channel insulating layer 150ua and the second upper channel insulating layer 150ub may include different insulating materials, but the materials included therein are not limited thereto. For example, the first upper channel insulating layer 150ua and the second upper channel insulating layer 150ub may include the same insulating material.

In a process operation described with reference to FIG. 14E for the second upper channel insulating layer 150ub, after the etch-back process and/or a chemical mechanical planarization (CMP) process of the first upper channel insulating layer 150ua, a second upper channel insulating layer 150ub is additionally deposited, and then, the etch-back process and/or a CMP process may be performed once more, thereby forming a channel pad 155 on the channel insulating layer 150.

When the second upper channel insulating layer 150ub is additionally stacked on the first upper channel insulating layer 150ua, an upper end of the upper slit SLU disposed on an uppermost end of the channel structure CH may be disposed on a level lower than when only the first upper channel insulating layer 150au is formed. Alternatively or additionally, an upper end of the upper slit SLU may be formed to be further blunt than when only the first upper channel insulating layer 150au is formed. Alternatively or additionally, the volume of the upper slit SLU may be formed relatively small. In some example embodiments, a crack phenomenon in the semiconductor device may be reduced.

Figure 8:
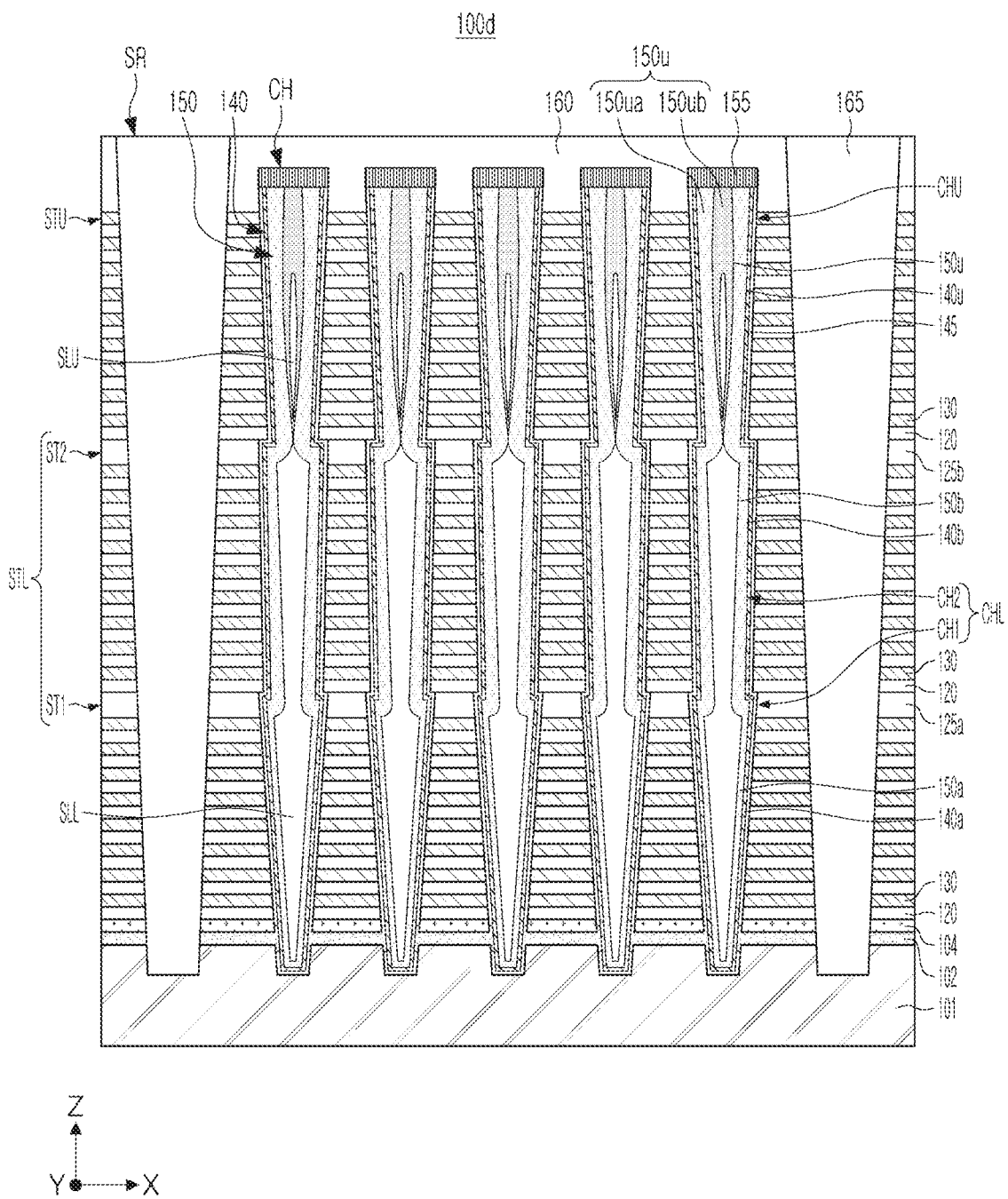
FIG. 8 is a schematic cross-sectional view of a semiconductor device according to some example embodiments.

FIG. 8 is a schematic cross-sectional view of a semiconductor device according to some example embodiments.

Referring to FIG. 8, in a semiconductor device 100d, a lower slit SLL of the channel structure CH may be an empty space connected as one, and the upper channel insulating layer 150u may include a first upper channel insulating layer 150ua and a second upper channel insulating layer 150ub sequentially stacked on the upper channel layer 140u.

The lower slit SLL of some example embodiments may not include an empty space of which the lower, upper and side surfaces are surrounded by the first lower channel insulating layer 150a and an empty space of which the lower, upper and side surfaces are surrounded by the second lower channel insulating layer 150b. The lower slit SLL may be surrounded by the lower channel insulating layers 150a and 150b. The lower slit SLL may extend from the first channel structure CH1 to the interior of the second channel structure CH2, to be connected and disposed between the first channel structure CH1 and the second channel structure CH2.

The upper end of the first lower channel insulating layer 150a may not fill the inside of the channel layer 140 without an empty space. The lower end of the second lower channel insulating layer 150b may not fill the inside of the channel layer 140 without an empty space. For example, in the z direction of a region where the first lower channel insulating layer 150*a* and the second lower channel insulating layer 150*b* are connected, the lower channel insulating layers 150*a* and 150*b* may surround the lower slit SLL.

The thickness of the upper channel insulating layer 150*u* may be greater than either or both of the thicknesses t1 and t2 of the lower channel insulating layers 150*a* and 150*b*. The thickness of the first lower channel insulating layer 150*a* and the thickness of the second lower channel insulating layer 150*b* are substantially the same, or, alternatively, the thickness of the second lower channel insulating layer 150*b* may be greater than the thickness of the first lower channel insulating layer 150*a*.

The first upper channel insulating layer 150*ua* may be disposed on the upper channel layer 140*u*, and the second upper channel insulating layer 150*ub* may be disposed on the first upper channel insulating layer 150*ua*. The first upper channel insulating layer 150*ua* may surround the second upper channel insulating layer 150*ub*. The first upper channel insulating layer 150*ua* may be disposed between the upper channel layer 140*u* and the second upper channel insulating layer 150*ub*. An empty space/air gap may be formed inside of the second upper channel insulating layer 150*ub*. The second upper channel insulating layer 150*ub* may surround the upper slit SLU. The second upper channel insulating layer 150*ub* may be contact with the upper slit SLU.

In some example embodiments, the first upper channel insulating layer 150*ua* and the second upper channel insulating layer 150*ub* may include, e.g. may be, different insulating materials, but are not limited thereto, and may include or may be the same insulating material.

In the process operation described with reference to FIG. 14E for the second upper channel insulating layer 150*ub*, after the etch-back process/CMP process of the first upper channel insulating layer 150*ua*, a process of additionally depositing a second upper channel insulating layer 150*ub* is performed, and then, the etch-back process/CMP process may be performed once more, thereby forming a channel pad 155 on the channel insulating layer 150.

Figure 9:
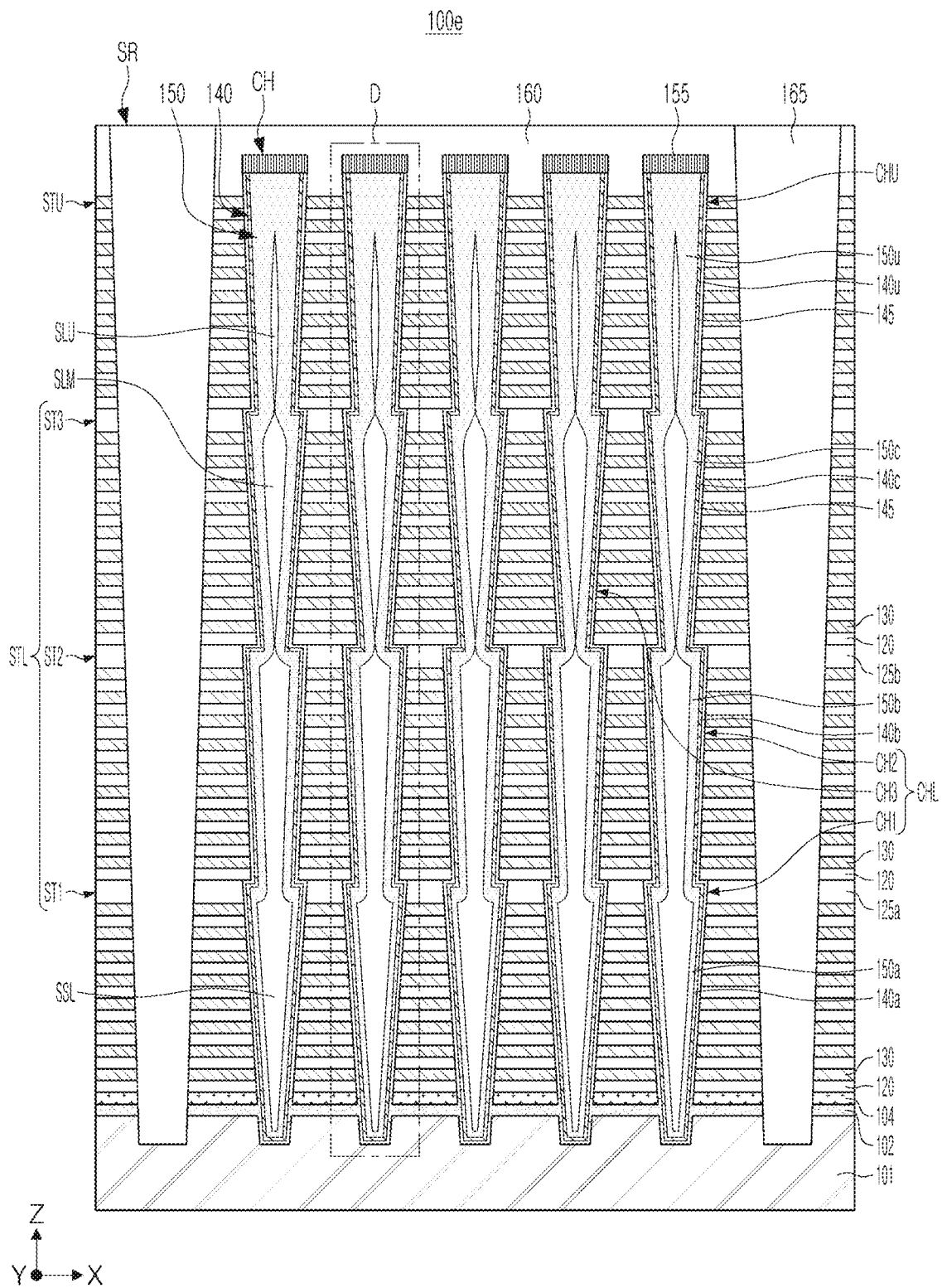
FIG. 9 is a schematic cross-sectional view of a semiconductor device according to some example embodiments.

FIG. 9 is a schematic cross-sectional view of a semiconductor device according to some example embodiments.

Figure 10:
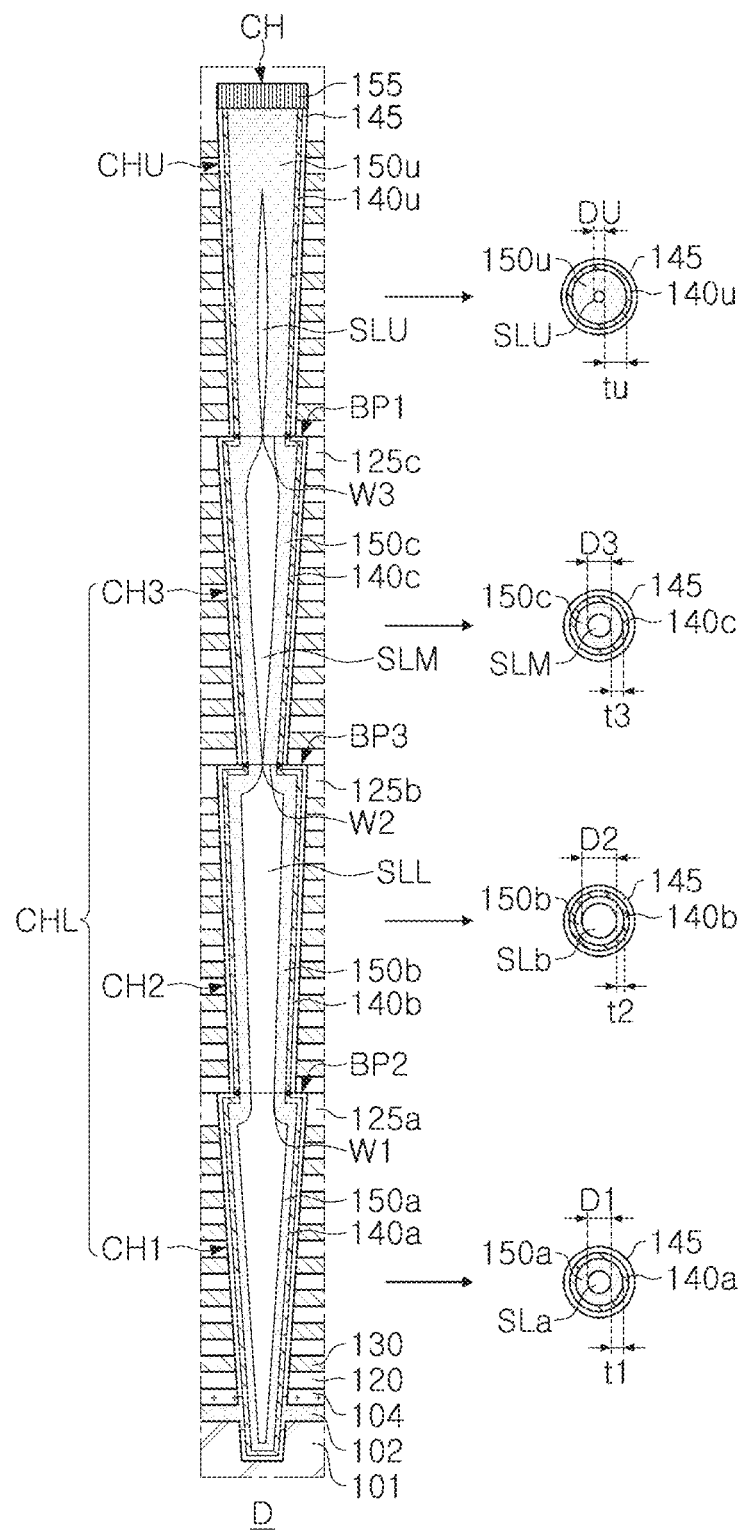
FIG. 10 is a schematic enlarged cross-sectional view and a plan view of a channel structure of a semiconductor device according to some example embodiments.

FIG. 10 is a schematic enlarged cross-sectional view and a plan view of a channel structure of a semiconductor device according to some example embodiments. FIG. 10 is a schematic cross-sectional view of the channel structure by enlarging area D of FIG. 9.

Referring to FIGS. 9 and 10, in a semiconductor device 100*e*, a lower stack structure STL may include a first stack structure ST1, a second stack structure ST2 disposed on the first stack structure ST1, and a third stack structure ST3 disposed on the second stack structure ST2. The lower channel structure CHL may include a first channel structure CH1, a second channel structure CH2 disposed on the first channel structure CH1, and a third channel structure CH3 disposed on the second channel structure CH2. The channel structure CH may include a lower slit SLL connected as one, an intermediate slit SLM disposed on a level higher than the lower slit SLL, and an upper slit SLU disposed on a level higher than the intermediate slit SLM. The height of each of the first channel structure CH1, the second channel structure CH2, and the third channel structure CH3 may be the same as, or may be different from, one another.

The first channel structure CH1 may be disposed on a level lower than the second channel structure CH2, and the second channel structure CH2 may be disposed on a level lower than the third channel structure CH3. Since the width of the lower portion of the second channel structure CH2 is less than the width of the upper portion of the first channel structure CH1, the lower channel structure CHL may include a second bent portion BP2 due to the difference in widths between the first channel structure CH1 and the second channel structure CH2. Since the width of the lower portion of the third channel structure CH3 is less than the width of the upper portion of the second channel structure CH2, the lower channel structure CHL may include a third bent portion BP3, due to or based on the difference in widths between the second channel structure CH2 and the second channel structure CH3.

The lower slit SLL may extend from the first channel structure CH1 to the inside of the second channel structure CH2 and may be connected and disposed between the first channel structure CH1 and the second channel structure CH2.

The lower slit SLL, the intermediate slit SLM, and the upper slit SLU may be disposed to be spaced apart, e.g. spaced apart from each other.

At least one of the widths D1 and D2 of the lower slit SLL and a width D3 of the intermediate slit SLM may be greater than the width DU of the upper slit SLU. The volumes of the lower slit SLL and the intermediate slit SLM may be greater than the volume of the upper slit SLU. In some example embodiments, in the connected lower slit SLL, the width D1 of the third lower slit SLa disposed at a relatively lower level may be substantially the same as the width D2 of the fourth lower slit SLb disposed at a relatively high level, or may be greater than the width D2 of the fourth lower slit SLb, and the width D2 of the fourth lower slit SLb may be greater than the width D3 of the intermediate slit SLM. In an example embodiment, the width D3 of the intermediate slit SLM may be greater than the width DU of the upper slit SLU. In some example embodiments, the volume of the third lower slit SLa may be substantially equal to the volume of the fourth lower slit SLb or greater than the volume of the fourth lower slit SLb, and the volume of the second lower slit SL2 may be greater than the volume of the intermediate slit SLM. In some example embodiments, the volume of the intermediate slit SLM may be greater than the volume of the upper slit SLU.

The third channel structure CH3 may further include a third channel layer 140*c*, a third channel insulating layer 150*c* disposed on the third channel layer 140*c*, and an intermediate slit SLM disposed inside of the third channel insulating layer 150*c*. The third channel insulating layer 150*c* may surround the intermediate slit SLM. The third channel insulating layer 150*c* may fill the inside of the channel layer 140 such that there is no empty space in the center of the channel structure CH, in a region adjacent to a third intermediate insulating layer 125*c*. The third channel insulating layer 150*c* may surround the lower, upper, and side surfaces of the intermediate slit SLM. The third channel insulating layer 150*c* may be in contact with/in direct contact with the lower, upper, and side surfaces of the intermediate slit SLM.

The thickness to of the upper channel insulating layer 150*u* may be greater than any or all of the thicknesses t1, t2 and t3 of the lower channel insulating layers 150*a*, 150*b* and 150*c*. In some example embodiments, the thickness t3 of the third channel insulating layer 150*c* may be greater than the thickness t2 of the second lower channel insulating layer 150*b* and may be greater than the thickness t1 of the first lower channel insulating layer 150*a*.

In some example embodiments, a minimum width W2 of the third channel structure CH3 may be less than a minimum width W1 of the second channel structure CH2. In addition, the minimum width W2 of the third channel structure CH3 may be greater than a minimum width W3 of the upper channel structure CHU.

Figure 11:
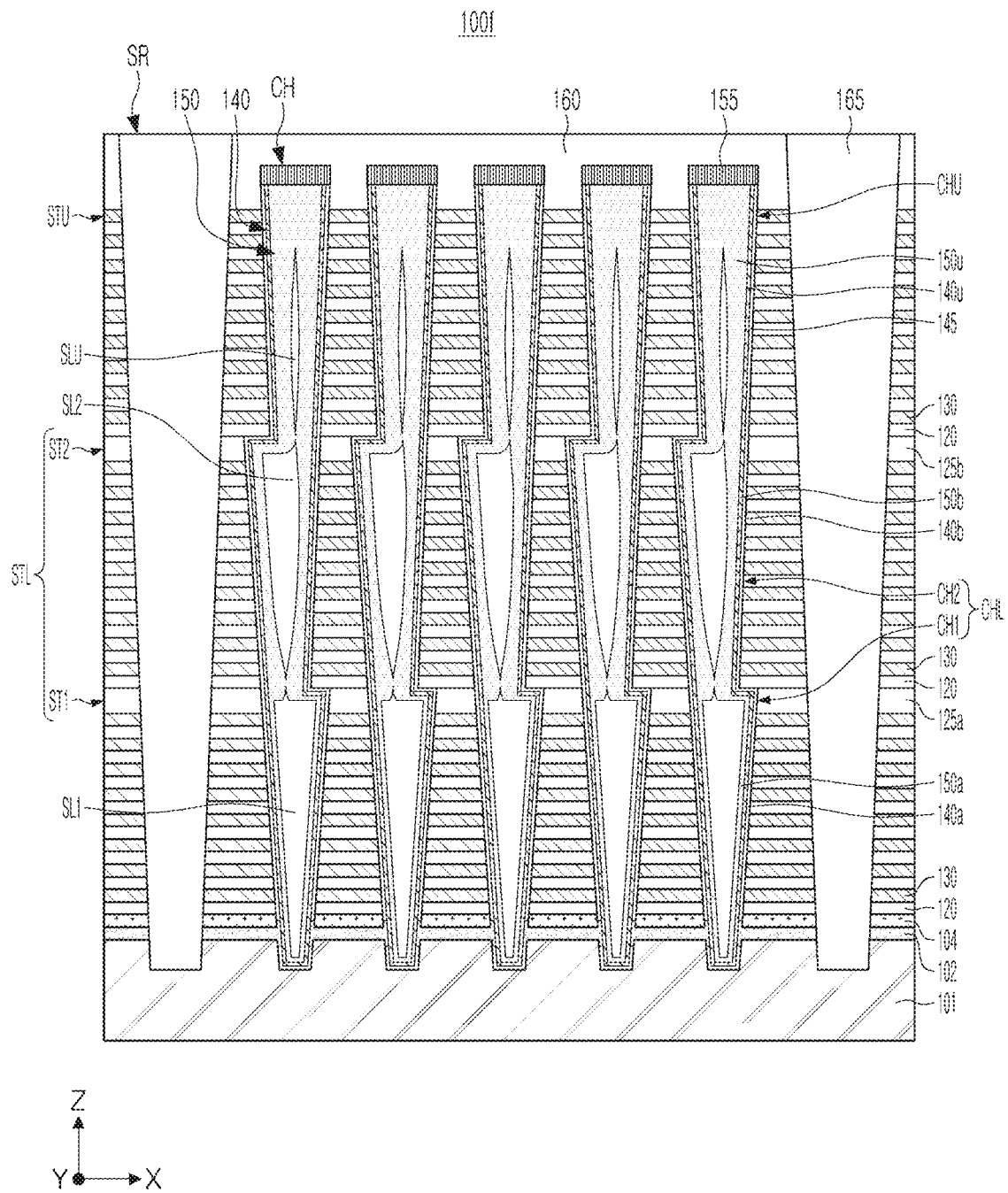
FIG. 11 is a schematic cross-sectional view of a semiconductor device according to some example embodiments.

FIG. 11 is a schematic cross-sectional view of a semiconductor device according to some example embodiments.

Referring to FIG. 11, in a semiconductor device 100*f*, a center of the second channel structure CH2 with respect to a center of the first channel structure CH1 may not be aligned on a straight line, but may be shifted, e.g. may be shifted in the X direction and/or the Y direction. In some example embodiments, the center of the upper channel structure CHU is not aligned with respect to the center of the second channel structure CH2 in a straight line, but may be aligned by shifting with respect to the center of the second channel structure CH2. The center of the second channel structure CH2 may be moved and located on the X-Y plane from the center of the first channel structure CH1. In some example embodiments, the center of the upper channel structure CHU may be moved and located on the X-Y plane from the center of the second channel structure CH2. In some example embodiments, the channel layer 140 and the channel insulating layer 150 in the first channel structure CH1, the second channel structure CH2 and the upper channel structure CHU may also be connected to each other. The shape of the semiconductor device 100*f* of FIG. 11 may be equally applied to the some example embodiments described with reference to FIGS. 1 to 10.

Figure 12:
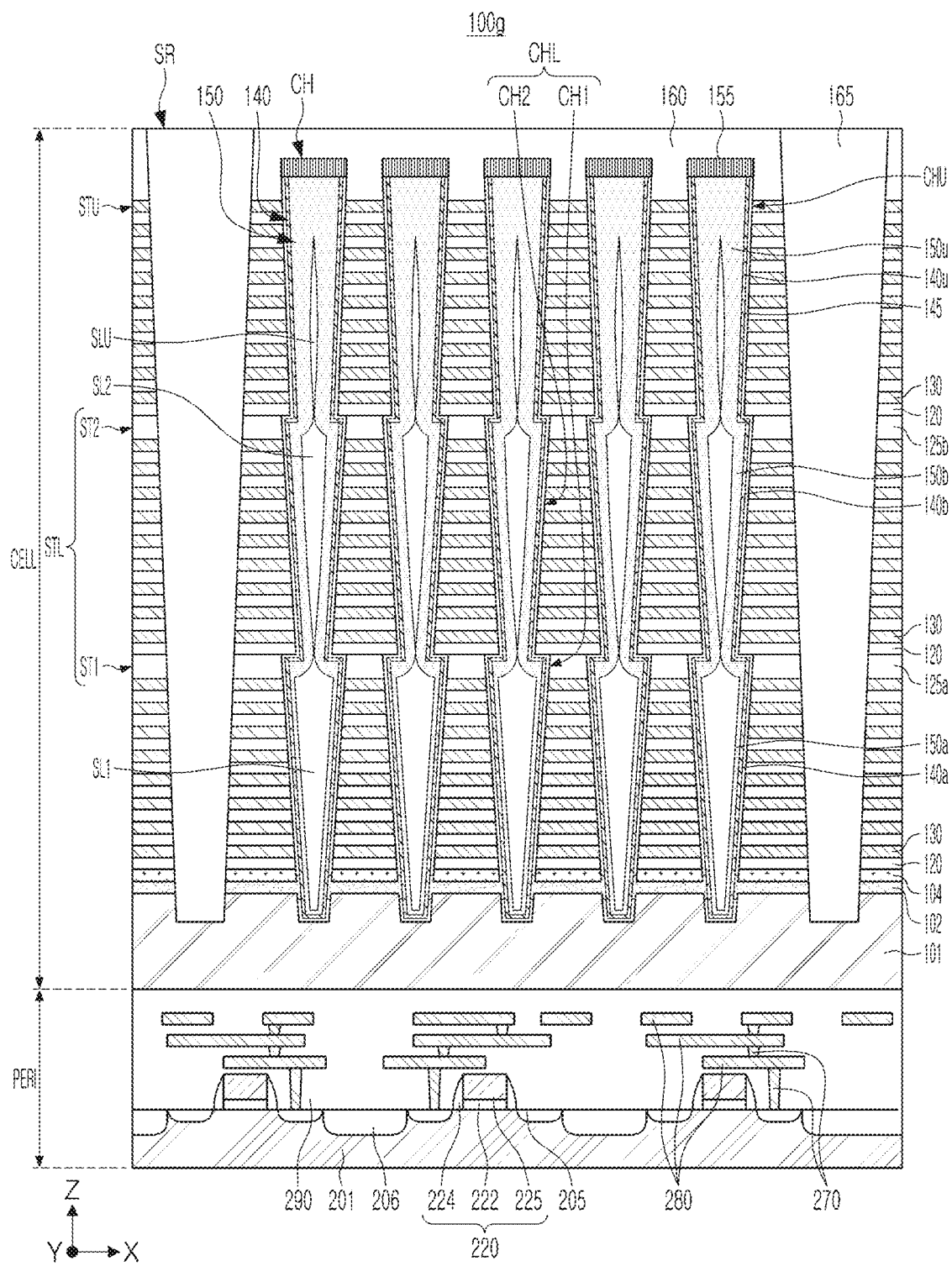
FIG. 12 is a schematic cross-sectional view of a semiconductor device according to some example embodiments.

FIG. 12 is a schematic cross-sectional view of a semiconductor device according to some example embodiments.

Referring to FIG. 12, a semiconductor device 100*g* may include a peripheral circuit structure PERI including a base substrate 201, and a memory cell structure CELL including a substrate 101. The memory cell structure CELL may be disposed on the peripheral circuit structure PERI.

The peripheral circuit structure PERI may include the base substrate 201, source/drain regions 205 and device isolation layers 206 in the base substrate 201, circuit elements 220, circuit contact plugs 270, circuit wiring lines 280 and a peripheral area insulating layer 290 which are on the base substrate 201.

The base substrate 201 may have an upper surface extending in the X and Y directions. An active region may be defined in the base substrate 201 by the device isolation layers 206. The source/drain regions 205 including impurities such as at least one of boron, phosphorus, or arsenic may be disposed in a portion of the active region. The base substrate 201 may include a semiconductor material, such as a group IV semiconductor, a group III-V compound semiconductor, or a group II-VI compound semiconductor. The base substrate 201 may be provided as a bulk wafer and/or an epitaxial layer.

The circuit elements 220 may include a planar transistor and/or other active and/or passive devices such as resistors, capacitors, memristors, or diodes. Each of the circuit elements 220 may include a circuit gate dielectric layer 222, a spacer layer 224, and a circuit gate electrode 225. The source/drain regions 205 may be disposed in the base substrate 201, on both sides of the circuit gate electrode 225.

The peripheral area insulating layer 290 may be disposed on the circuit element 220, on the base substrate 201. The circuit contact plugs 270 may penetrate through the peripheral area insulating layer 290 and are connected to the source/drain regions 205. An electric signal such as a voltage may be applied to the circuit element 220 by the circuit contact plugs 270. In a region not illustrated, the circuit contact plugs 270 may also be connected to the circuit gate electrode 225. The circuit wiring lines 280 may be connected to the circuit contact plugs 270 and may be disposed in a plurality of layers.

In the semiconductor device 100*g*, after the peripheral circuit area PERI is first manufactured, the substrate 101 of the memory cell area CELL is formed thereon to manufacture the memory cell area CELL. The substrate 101 may have the same size as the base substrate 201 or may be formed to have the size smaller than the base substrate 201.

For other configurations, the description described above with reference to FIGS. 1 to 2 may be equally applied.

The form in which the memory cell region CELL and the peripheral circuit area PERI are vertically stacked may also be applied to some example embodiments of the semiconductor device described with reference to FIGS. 1 to 11.

Figure 13:
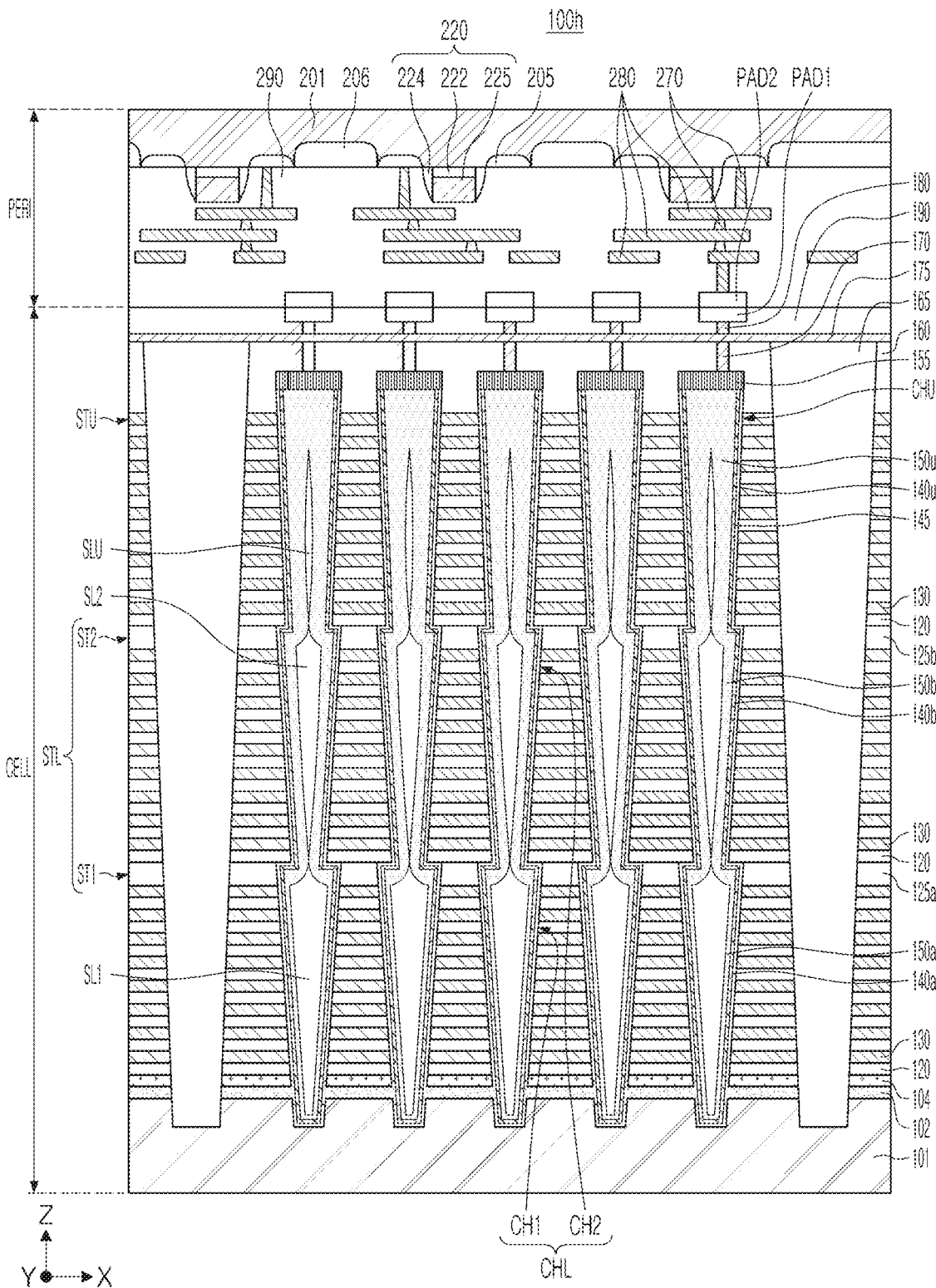
FIG. 13 is a schematic cross-sectional view of a semiconductor device according to some example embodiments.

FIG. 13 is a schematic cross-sectional view of a semiconductor device according to some example embodiments.

Referring to FIG. 13, in a semiconductor device 100*h*, a memory cell structure CELL may be disposed below a peripheral circuit structure PERI.

In the semiconductor device 100*a* described in FIGS. 1 to 2, the memory cell structure CELL may further include a channel contact plug 170, bit lines 175 disposed on the channel contact plug 170, and an upper insulating layer 190 and an upper vertical wiring 180 disposed on the cell region insulating layer 160. Also, the memory cell structure CELL may further include first bonding pads PAD1. At least some of the first bonding pads PAD1 may be disposed between the bit lines 175 and the peripheral circuit structure PERI. The peripheral circuit structure PERI may further include second bonding pads PAD2 in a region corresponding to the first bonding pads PAD1 of the memory cell structure CELL. The second bonding pads PAD2 may contact and be bonded to the first bonding pads PAD1. A peripheral circuit may be disposed on the second bonding pads PAD2, and the base substrate 201 may be disposed on the peripheral circuit.

The channel contact plug 170, the bit lines 175, and the upper vertical wiring 180 may be connected/electrically connected to each other. The bit lines 175 may be electrically connected to a plurality of channel vertical structures CH, between the peripheral circuit structure PERI and the stack structures STL and STU.

The upper insulating layer 190 may be formed of an insulating material. The upper vertical wiring 180 and the bit lines 175 may be formed of a conductive material. The first bonding pad PAD1 and the second bonding pad PAD2 may include a conductive material, for example, copper (Cu) or the like. In some example embodiments, the memory cell structure CELL and the peripheral circuit structure PERI may be bonded by, for example, copper (Cu)-copper (Cu) bonding.

For other configurations, the description described above with reference to FIGS. 1 to 2 may be equally applied.

The memory cell structure CELL of the semiconductor device 100*h* in some example embodiments is disposed below the peripheral circuit structure PERI, and the bonding form therebetween by copper-copper bonding may also be applied in the same manner to the some example embodiments of the semiconductor device described with reference to FIGS. 1 to 11.

Example embodiments are not limited to those described above. Furthermore, none of the above-described example embodiments are necessarily mutually exclusive to one another. For example, some example embodiments may include features described with reference to one figure, and may also include features described with reference to another figure.

FIGS. 14A to 14F schematically illustrate a method of manufacturing/fabricating a semiconductor device according to some example embodiments. In FIGS. 14A to 14F, cross-sections corresponding to FIG. 1 are illustrated.

Figure 14A:
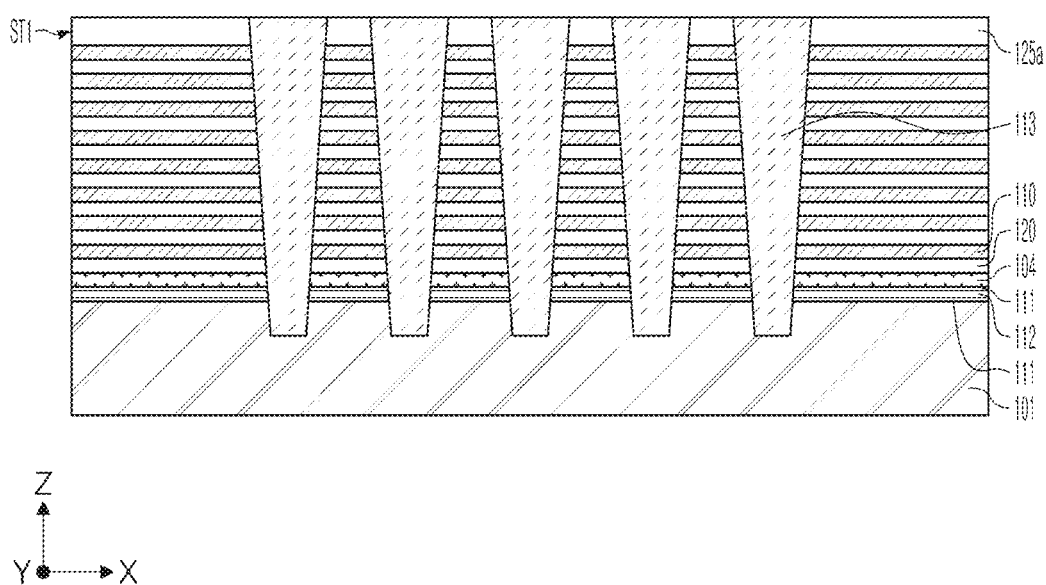
FIGS. 14A to 14F schematically illustrate a method of manufacturing a semiconductor device according to some example embodiments.

Referring to FIG. 14A, first and second source sacrificial layers 111 and 112 and a second conductive layer 104 are formed on a substrate 101, and a first stack structure ST1 may be formed by alternately stacking first horizontal sacrificial layers 110 and interlayer insulating layers 120. Next, after partially removing the first stack structure ST1, a first through sacrificial layer 113 may be formed.

First, the first and second source sacrificial layers 111 and 112 may include, e.g. may be, different materials, and may be stacked on the substrate 101 in such a manner that the first source sacrificial layers 111 are disposed on and below the second source sacrificial layer 112. The first and second source sacrificial layers 111 and 112 may be layers replaced with a first horizontal conductive layer 102 of FIG. 14F through a subsequent process. For example, the first source sacrificial layer 111 may be formed of the same material as the interlayer insulating layers 120, and the second source sacrificial layer 112 may be formed of the same material as the first horizontal sacrificial layers 110. The second horizontal conductive layer 104 may be deposited on the first and second source sacrificial layers 111 and 112. The first and second source sacrificial layers 111 and 112 may be formed with a chemical vapor deposition (CVD) process and/or an atomic layer deposition (ALD) process; however, example embodiments are not limited thereto.

Next, a first stack structure ST1 may be formed by alternately stacking the first horizontal sacrificial layers 110 and the interlayer insulating layers 120 on the second horizontal conductive layer 104. First horizontal sacrificial layers 110 and interlayer insulating layers 120 may be formed by an ALD process; however, example embodiments are not limited thereto.

The first horizontal sacrificial layers 110 may be layers that are replaced with gate electrodes 130 through a subsequent process. The first horizontal sacrificial layers 110 may be formed of a material different from that of the interlayer insulating layers 120. For example, the interlayer insulating layer 120 may be formed of at least one of silicon oxide and silicon nitride, and the first horizontal sacrificial layers 110 may be formed of a material which is different from that of the interlayer insulating layer 120 and which is selected from silicon, silicon oxide, silicon carbide, and silicon nitride. The thickness of the interlayer insulating layers 120 and the first horizontal sacrificial layers 110 and/or the number of layers constituting the same may be variously changed from those illustrated, and may be the same, or may be different, from one another.

The first intermediate insulating layer 125a may be stacked on an uppermost first horizontal sacrificial layer 110 of the first stack structure ST1. The first intermediate insulating layer 125a may be formed to have a thickness greater than that of the interlayer insulating layers 120.

Next, the first through sacrificial layer 113 may be formed to penetrate through the first stack structure ST1 in a position corresponding to the first channel structure CH1 of FIG. 1. In detail, first, a through-hole corresponding to the first channel structure CH1 may be formed, e.g. may be formed with a dry etching process/an anisotropic etching process. Due to the height of the first stack structure ST1 and/or an aspect ratio of the through-hole, the sidewall of the through-hole may not be perpendicular to the upper surface of the substrate 101; for example, the sidewall of the through-hole may be tapered. In some example embodiments, the through-hole may be formed to recess a portion of the substrate 101. The first through sacrificial layer 113 may be formed by filling the inside of the through-hole.

Figure 14B:
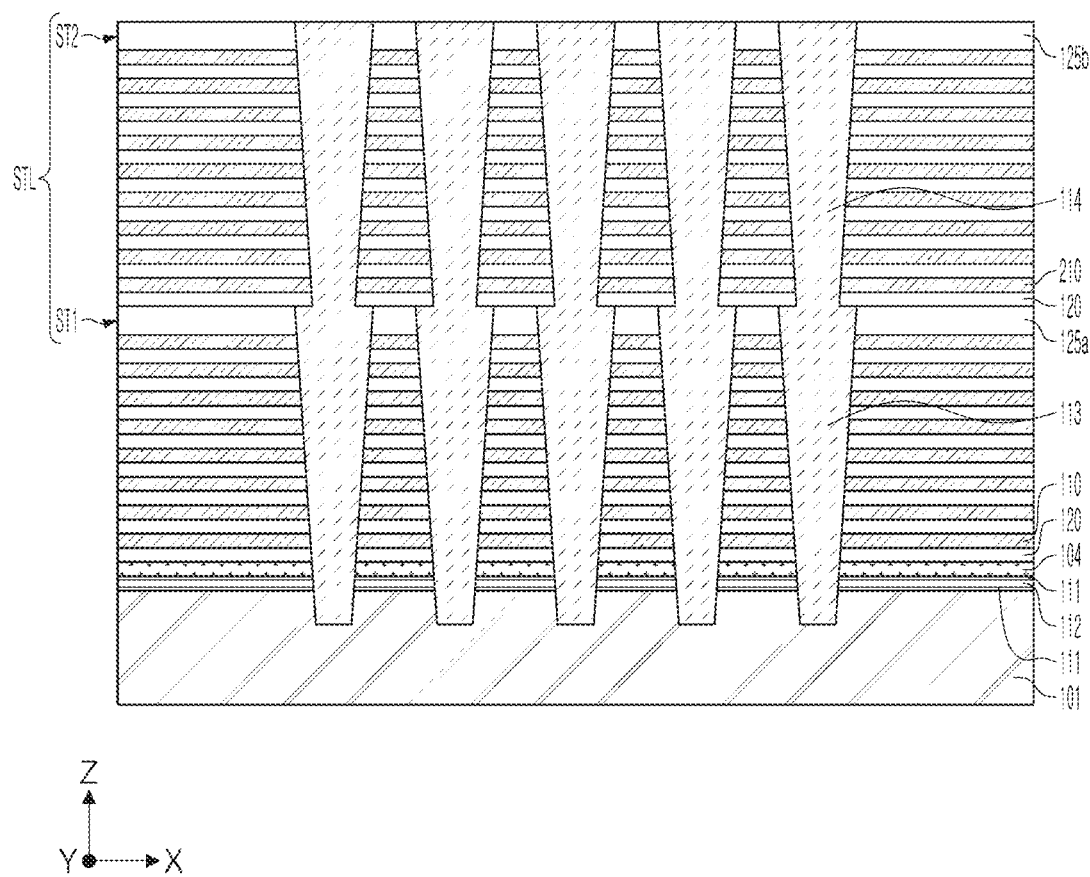

Referring to FIG. 14B, second horizontal sacrificial layers 210 and interlayer insulating layers 120 are alternately stacked on the first stack structure 125a, to form a second stack structure ST2. Next, after partially removing the second stack structure ST2, a second through sacrificial layer 114 may be formed.

Interlayer insulating layers 120 and second horizontal sacrificial layers 210 may be alternately stacked on the first intermediate insulating layer 125a. The second horizontal sacrificial layers 210 may be layers that are replaced with gate electrodes 130 through a subsequent process. The second horizontal sacrificial layers 210 may be formed in the same manner as the first horizontal sacrificial layers 110 described in FIG. 14A; however, example embodiments are not limited thereto. Alternatively or additionally, the interlayer insulating layers 120 alternately stacked with the second horizontal sacrificial layers 210 may be formed in the same manner as the interlayer insulating layers 120 of the first stack structure ST1; however, example embodiments are not limited thereto.

A second intermediate insulating layer 125b may be stacked on an uppermost second horizontal sacrificial layer 210 of the second stack structure ST2. The second intermediate insulating layer 125b may be formed to have a thickness greater than that of any of the interlayer insulating layers 120.

Next, the second through sacrificial layer 114 may be formed to penetrate through the second stack structure ST2 in a position corresponding to the second channel structure CH2 of FIG. 1. First, a through-hole corresponding to the second channel structure CH2 may be formed. Due to the height of the second stack structure ST2 and/or an aspect ratio of the through-hole, a sidewall of the through-hole may not be perpendicular to the upper surface of the substrate 101. Since the width of the through-hole decreases as the through-hole approaches the upper surface of the substrate 101, the width of the lower portion of the through-hole may be less than the width of the upper portion of the first through sacrificial layer 113. In some example embodiments, the through-hole may be formed to recess a portion of the substrate 101. The second through sacrificial layer 114 may be formed by filling the inside of the through-hole. The second through sacrificial layer 114 may include or be the same, or different materials from the first sacrificial through layer 113.

Since the width of the upper portion of the first through sacrificial layer 113 is greater than the width of the lower portion of the second through sacrificial layer 114, a bent portion may be formed due to the difference in widths between the first through sacrificial layer 113 and the second through sacrificial layer 114. A second bent portion BP2 of the channel structure CH of FIGS. 1 and 2 may be formed by the bent portion.

Figure 14C:
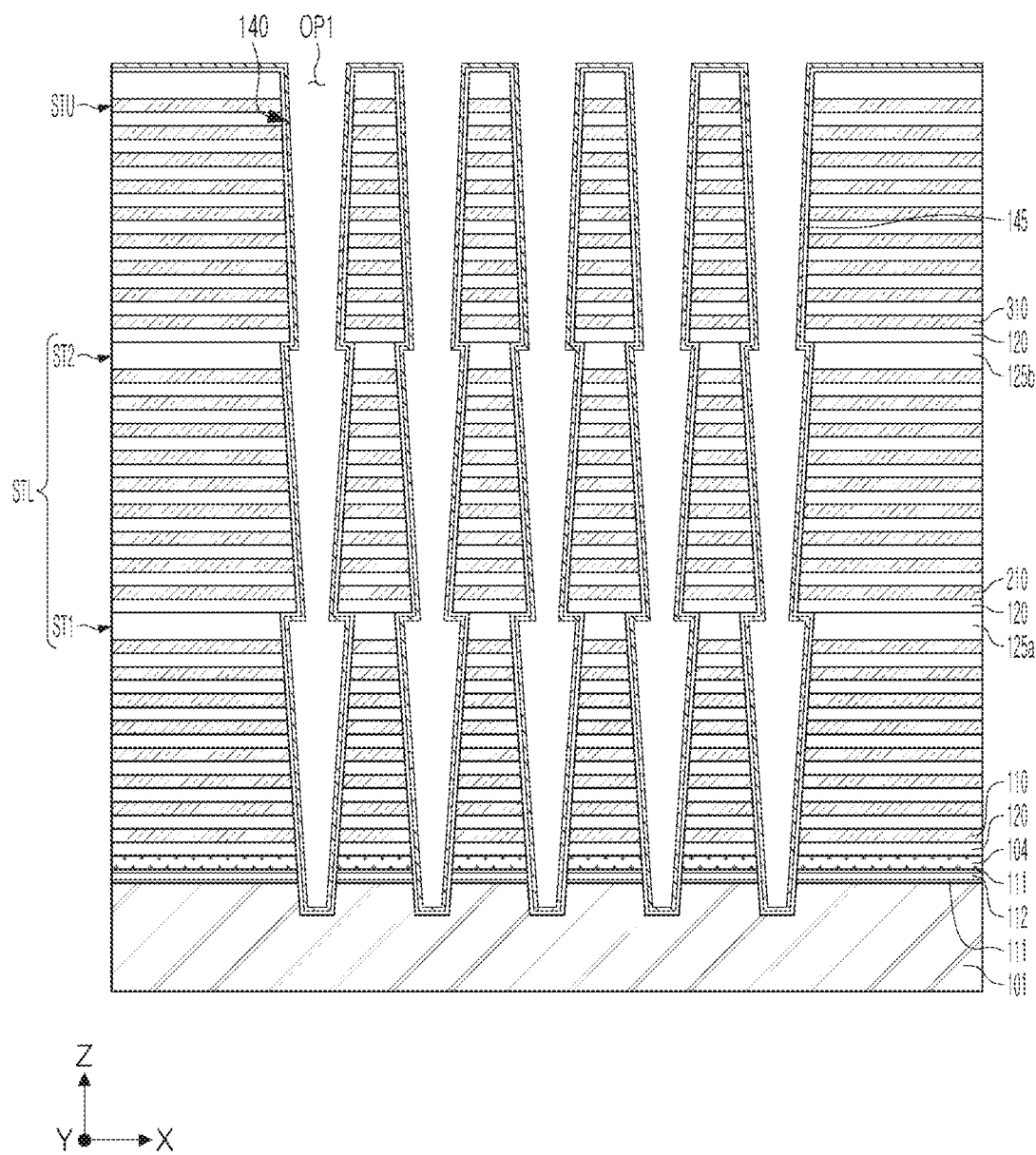

Referring to FIG. 14C, an upper stack structure STU may be formed by alternately stacking third horizontal sacrificial layers 310 and interlayer insulating layers 120 on the second stack structure ST2 in a same or different manner than the alternatively stacking of first horizontal sacrificial layers 110 and interlayer insulating layers 120. Next, a portion of the upper stack structure STU is removed, and the first and second through sacrificial layers 113 and 114 are removed together, to form a first opening OP1. Next, a gate dielectric layer 145 and a channel layer 140 may be sequentially stacked in the first opening OP1.

The interlayer insulating layers 120 and the third horizontal sacrificial layers 310 may be alternately stacked on the second intermediate insulating layer 125b. The third horizontal sacrificial layers 310 may be layers that are replaced with gate electrodes 130 through a subsequent process. The third horizontal sacrificial layers 310 may be formed in the same manner as the first horizontal sacrificial layers 110 described in FIG. 14A. Alternatively or additionally, the interlayer insulating layers 120 alternately stacked with the second horizontal sacrificial layers 210 may be formed in the same manner as the interlayer insulating layers 120 of the first stack structure ST1.

Next, the first opening OP1 may be formed by removing a portion of the upper stack structure STU, to penetrate through the upper stack structure STU, in a position corresponding to the upper channel structure CHU of FIG. 1. The first opening OP1 may extend to a region corresponding to the first channel structure CH1 and the second channel structure CH2 of FIG. 1 by removing the first and second through sacrificial layers 113 and 114 together. In some example embodiments, a minimum width of the first opening OP1 in a position corresponding to the upper channel structure CHU may be greater than a minimum width of the first opening OP1 in a region from which the through sacrificial layer 114 of FIG. 14B has been removed. In some example embodiments, the minimum width of the first opening OP1 in the position corresponding to the upper channel structure CHU may be substantially the same as the minimum width of the first opening OP1 in the region from which the through sacrificial layer 114 of FIG. 14B has been removed.

Due to the height of the upper stack structure STU/an aspect ratio of the first opening OP1, the sidewall of the first opening OP1 formed in the upper stack structure STU may not be perpendicular to the upper surface of the substrate 101. Since the width of the lower portion of the first opening OP1 formed in the upper stack structure STU is less than the width of the upper portion of the first opening OP1 formed in the second stack structure ST2, the bent portion due to the difference in widths may be formed. A first bent portion BP1 of the channel structure CH of FIGS. 1 and 2 may be formed by the bent portion.

A gate dielectric layer 145 and a channel layer 140 may be sequentially stacked in the first opening OP1 formed in a region corresponding to the channel structure CH of FIG. 1. The gate dielectric layer 145 and the channel layer 140 may be formed to have a uniform thickness using an atomic layer deposition (ALD) and/or chemical vapor deposition (CVD) process.

The gate dielectric layer 145 and the channel layer 140 may have a bent shape in a region adjacent to the bent portion by the bent portion formed in the process operation described with reference to FIGS. 14B and 14C.

Figure 14D:
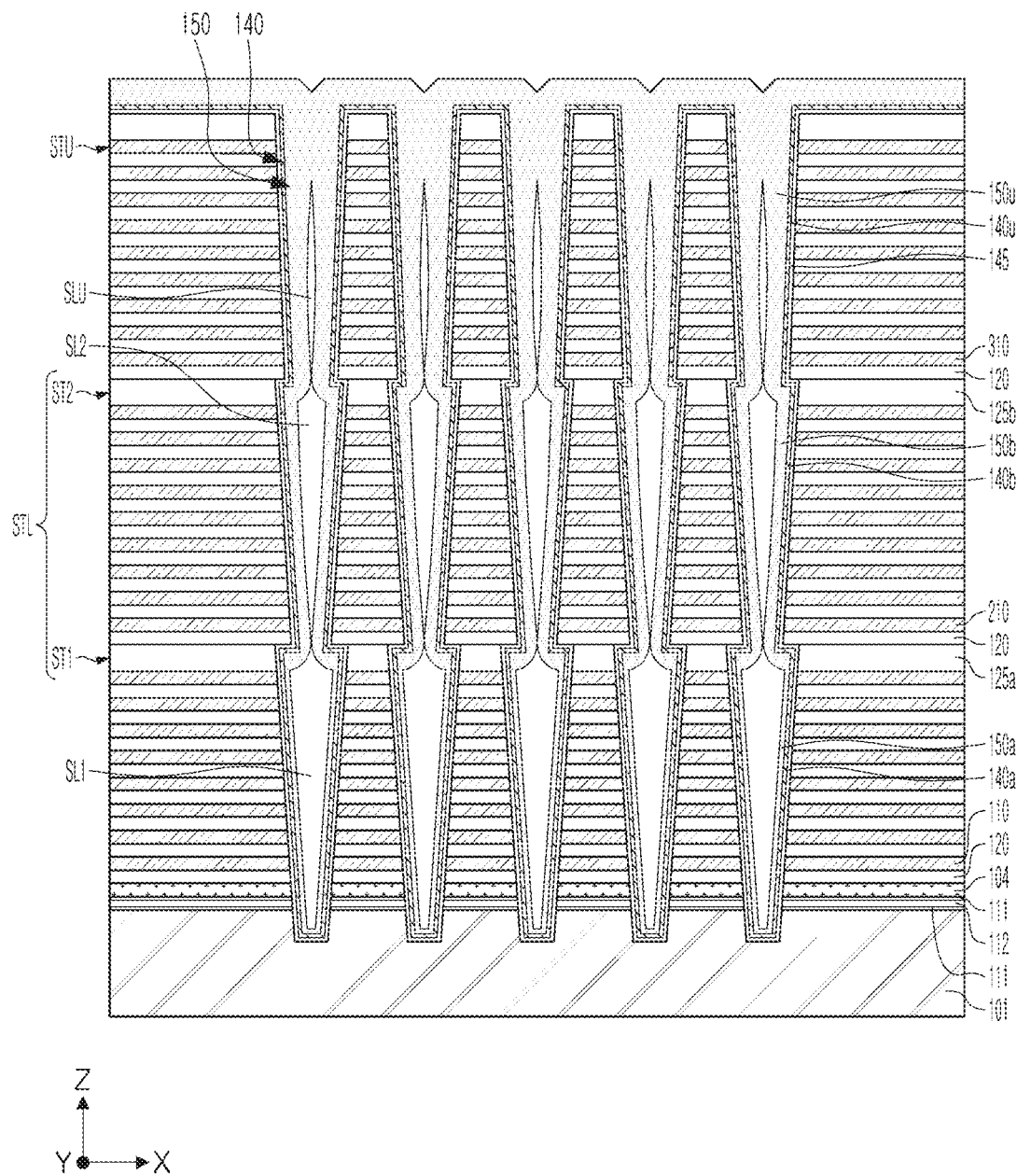

Referring to FIG. 14D, a channel insulating layer 150 may be formed to be stacked on the channel layer 140.

In the first opening OP1 formed in a region corresponding to the channel structure CH of FIG. 1, the channel insulating layer 150 may be stacked on the channel layer 140. The channel insulating layer 150 may be conformal, and may be formed using an atomic layer deposition (ALD) and/or chemical vapor deposition (CVD) process.

When the minimum width of the first opening OP1 in the region corresponding to the upper channel structure CHU of FIG. 1 is greater than the minimum width of the first opening OP1 in the region corresponding to the second lower channel structure CH2, a first lower slit SL1, a second lower slit SL2 and an upper slit SLU may be sequentially formed by uniformly stacking the channel insulating layer 150 by the atomic layer deposition (ALD) method. The channel insulating layer 150 is stacked along the inner side of the channel layer 140, and an empty space may be formed inside of at least a portion of the channel insulating layer 150. Since the minimum width of the first opening OP1 in the region corresponding to the second lower channel structure CH2 is less than the minimum width of the first opening OP1 in the region corresponding to the upper channel structure CHU, the empty space narrows toward the top of a lowermost first lower channel insulating layer 150a, such that upper end portions may first contact inside of the channel layer 140, to form a first lower slit SL1. Then, the upper ends of the second lower channel insulating layer 150b may contact inside of the channel layer 140 to form the second lower slit SL2. Next, the upper slit SLU may be formed.

Since the first lower slit SL1, the second lower slit SL2, and the upper slit SLU are sequentially formed, the upper portions of the first lower channel insulating layer 150a forming the first lower slit SL1 may first contact in terms of the process step. Accordingly, since the first lower channel insulating layer 150a has a relatively smaller amount of insulating material stacked than that of the second lower channel insulating layer 150b, the first lower channel insulating layer 150a has a thickness less than that of the second lower channel insulating layer 150b.

Since the upper portions of the second lower channel insulating layer 150b forming the second lower slit SL2 abut, the upper channel insulating layer 150u has a relatively greater amount of insulating material than that of the second lower channel insulating layer 150b, and the thickness of the second lower channel insulating layer 150b may be greater than the thickness of the upper channel insulating layer 150u.

Figure 14E:
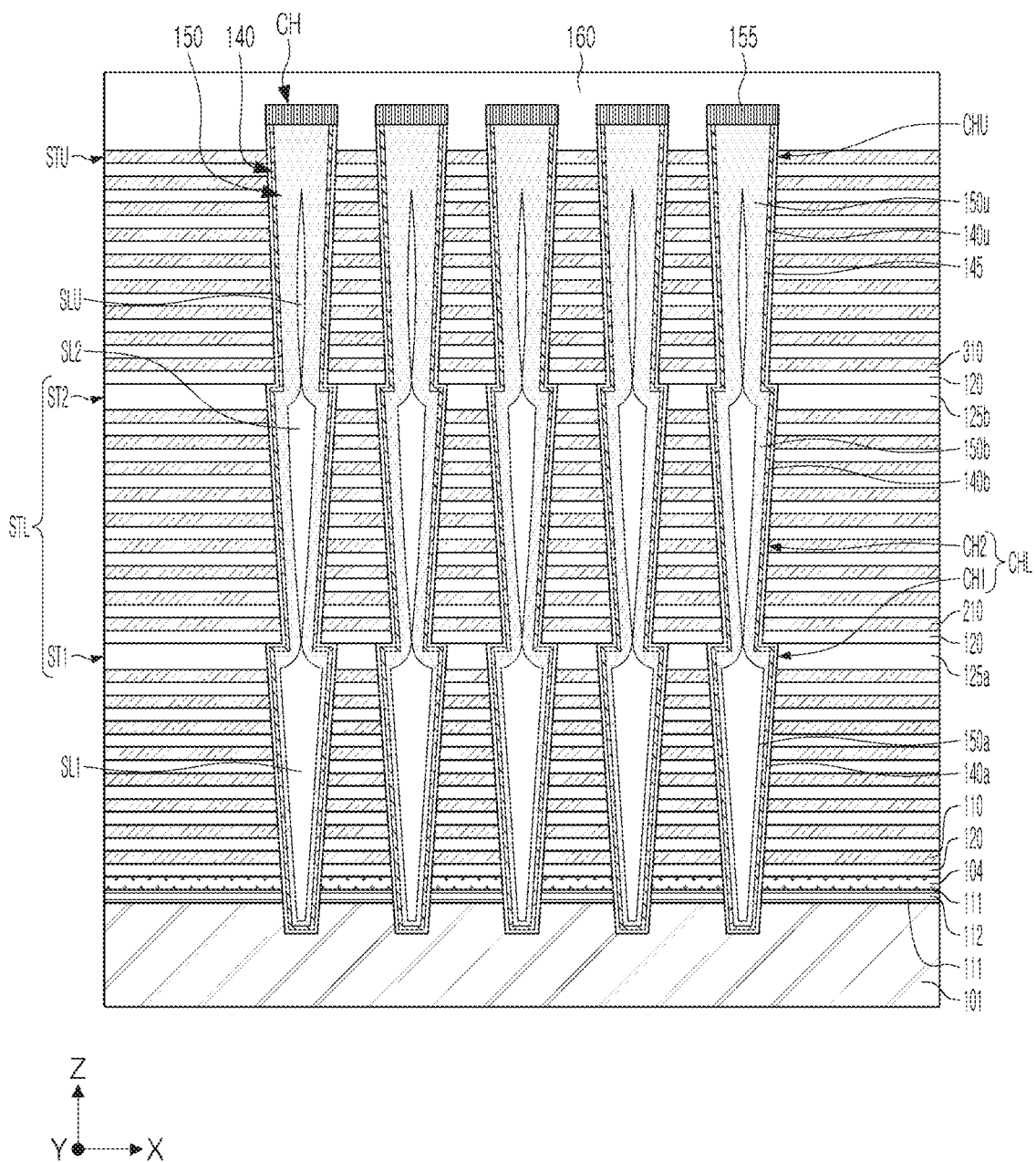

Referring to FIG. 14E, an etch-back process and/or a CMP process may be performed such that the channel insulating layer 150 is disposed only in a region in which the channel structure CH is disposed, and the channel pad 155 may be formed on the channel insulating layer 150. The channel pad 155 may be formed of a conductive material such as aluminum, copper, tungsten, or a combination thereof.

Figure 14F:
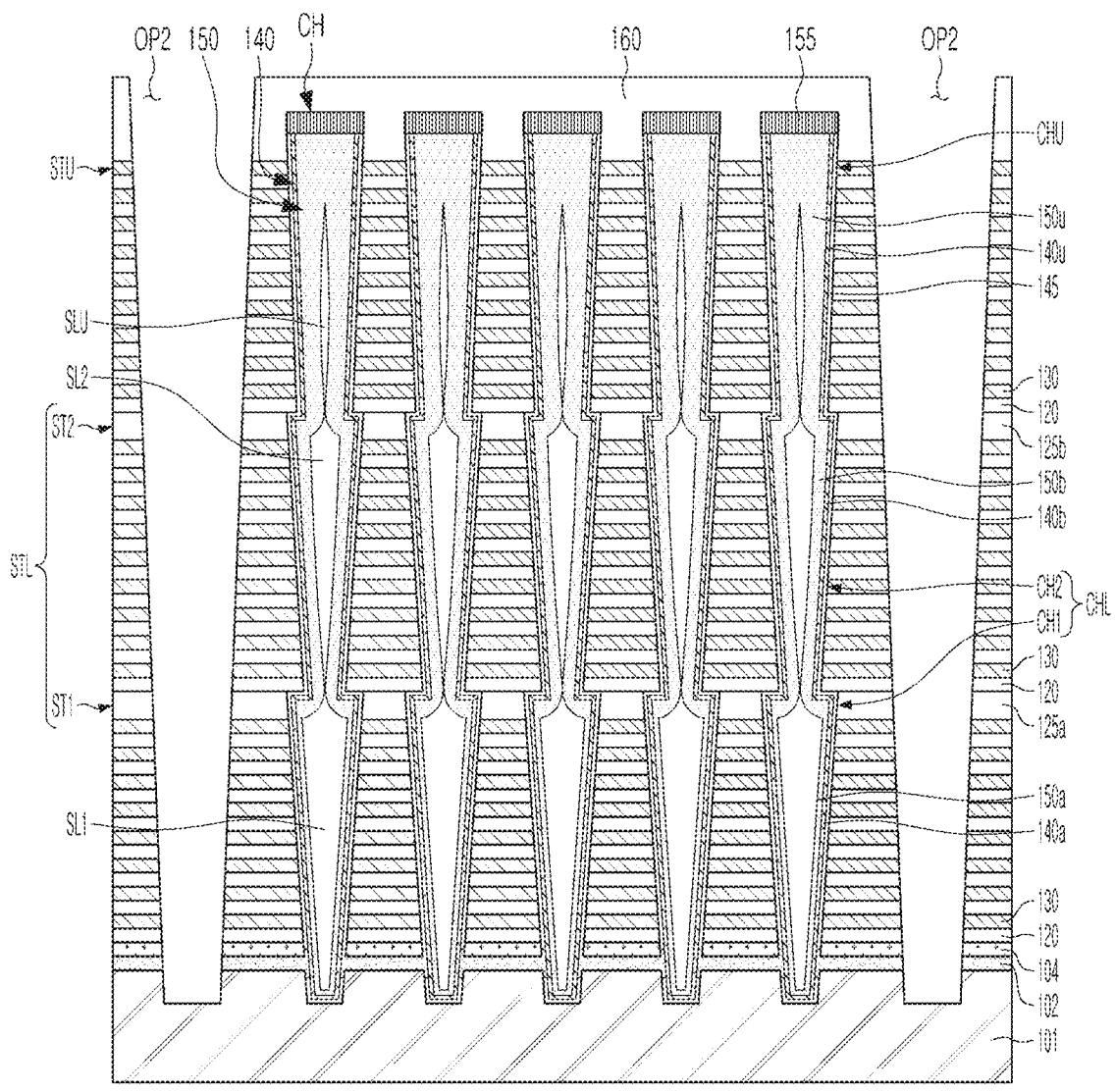

Referring to FIG. 14F, a second opening OP2 may be formed in a position corresponding to the separation structure SR of FIG. 1, and after the first and second source sacrificial layers 111 and 112 are removed through the second opening OP2, the first horizontal conductive layer 102 may be formed. Next, the gate electrodes 130 may be formed by removing the horizontal sacrificial layers 110, 210 and 310 exposed through the second opening OP2.

In some example embodiments, before removing the first and second source sacrificial layers 111 and 112, a spacer layer is formed on the sidewall of the second opening OP2 to protect the first to third horizontal sacrificial layers 110, 210 and 310. After the second source sacrificial layer 112 is first removed through the second opening OP2, the first source sacrificial layers 111 may be removed. The first and second source sacrificial layers 111 and 112 may be removed by, for example, a wet etching process. During the removal process of the first source sacrificial layers 111, a portion of the gate dielectric layer 145 exposed in the region from which the second source sacrificial layer 112 has been removed may be removed together. After forming the first horizontal conductive layer 102 by depositing a conductive material in the region from which the first and second source sacrificial layers 111 and 112 have been removed, the spacer layer may be removed. The first horizontal conductive layer 102 may directly contact the channel layer 140 in a region from which the gate dielectric layer 145 has been removed.

The first to third horizontal sacrificial layers 110, 210 and 310 may be selectively removed with respect to the interlayer insulating layers 120 using an etching process such as a wet etching process. The gate electrodes 130 may be formed by filling a region from which the first to third horizontal sacrificial layers 110, 210 and 310 have been removed, with a conductive material. The gate electrodes 130 may include metal, polycrystalline silicon, or metal silicide material.

Next, referring to FIG. 1 together, an isolation insulating layer 165 may be formed in the second opening OP.

Figure 15:
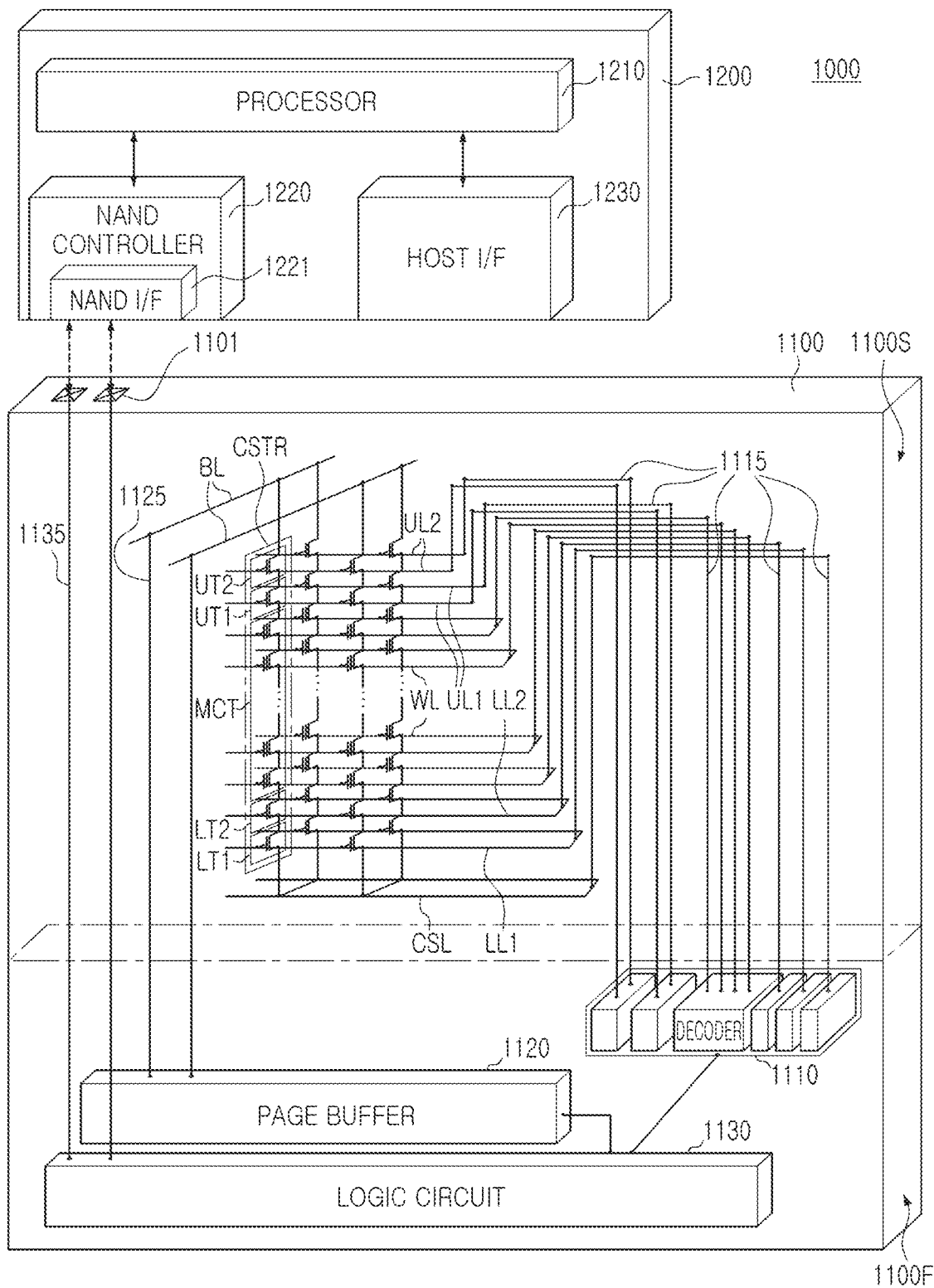
FIG. 15 is a schematic diagram of a data storage system including a semiconductor device according to some example embodiments.

FIG. 15 is a schematic diagram of a data storage system including a semiconductor device according to some example embodiments.

Referring to FIG. 15, a data storage system 1000 according to an example embodiment may include a semiconductor device 1100 and a controller 1200 electrically connected to the semiconductor device 1100. The data storage system 1000 may be or may include a storage device including one or a plurality of semiconductor devices 1100, or an electronic device including a storage device. For example, the data storage system 1000 may be or may include a universal serial bus (USB), a computing system, a medical device, a communication device, or a solid state drive (SSD) including one or more semiconductor devices 1100.

The semiconductor device 1100 may be a nonvolatile memory device, for example, a NAND flash memory device described above with reference to FIGS. 1 to 13. The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to some example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the interior of the first structure 1100F to the second structure 1100S. The bit lines BL may be electrically connected to the page buffer 1120 through second connection wirings 1125 extending from the first structure 1100F to the second structure 1100S.

In the first structure 1100F, the decoder circuit 1110 and the page buffer 1120 may execute a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through the input/output connection wiring 1135 extending from the first structure 1100F to the second structure 1100S.

The controller 1200 may include a processor 1210, a NAND controller 1220, and a host interface 1230. According to some example embodiments, the data storage system 1000 may include a plurality of semiconductor devices 1100, and in this case, the controller 1200 may control the plurality of semiconductor devices 1000.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 that processes communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command is received from an external host through the host interface 1230, the processor 1210 may control the semiconductor device 1100 in response to the control command.

Figure 16:
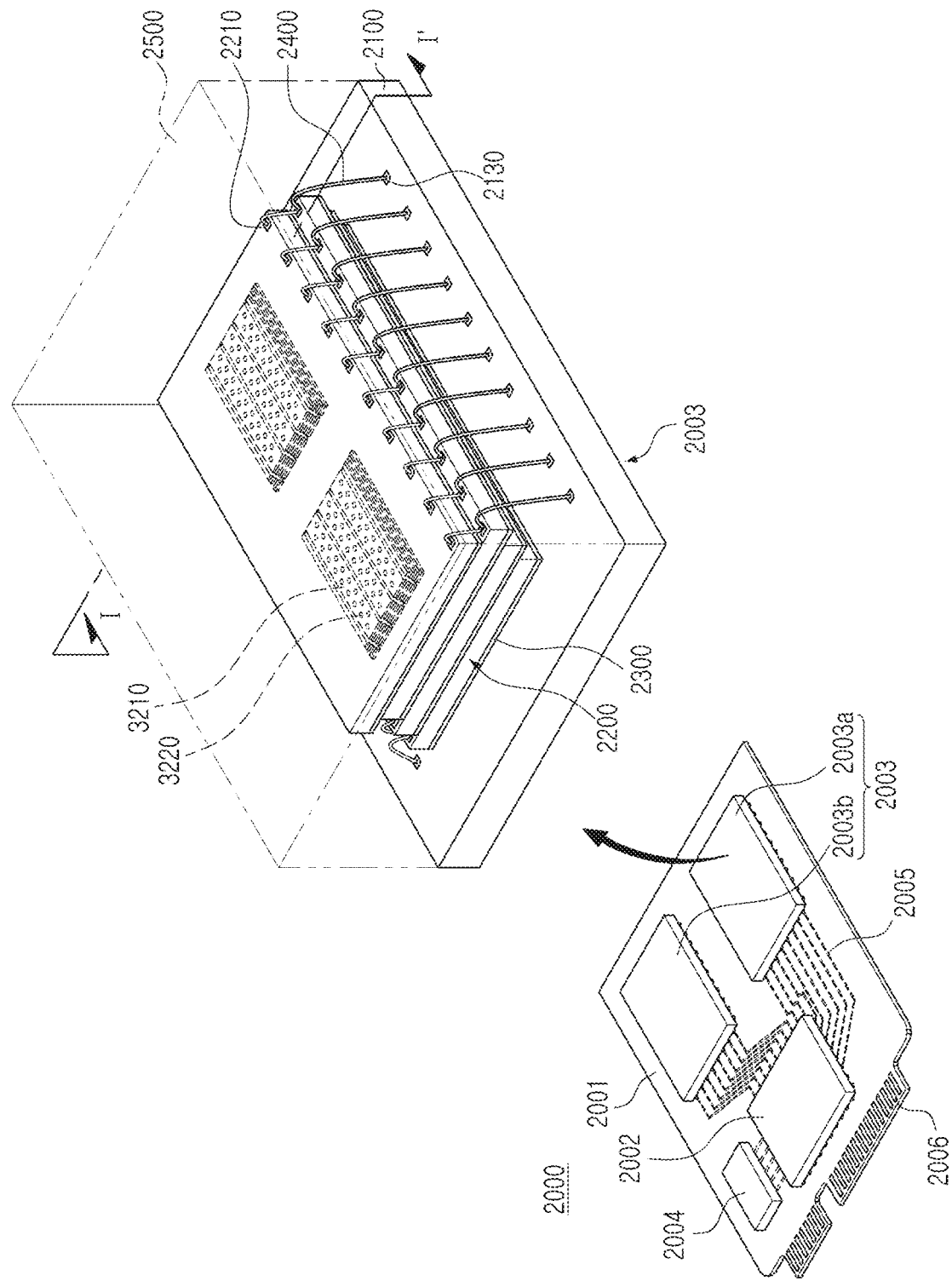
FIG. 16 is a schematic perspective view of a data storage system including a semiconductor device according to an example embodiment.

FIG. 16 is a schematic perspective view of a data storage system including a semiconductor device according to an example embodiment.

Referring to FIG. 16, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the data storage system 2000 and the external host. In some example embodiments, the data storage system 2000 may communicate with an external host according to any one of the interfaces such as Universal Serial Bus (USB), Peripheral Component Interconnect Express (PCI-Express), Serial Advanced Technology Attachment (SATA), M-Phy for Universal Flash Storage (UFS), and the like. In some example embodiments, the data storage system 2000 may be operated by power supplied from an external host through the connector 2006. The data storage system 2000 may further include a Power Management Integrated Circuit (PMIC) that distributes power supplied from the external host, to the controller 2002 and the semiconductor package 2003.

The controller 2002 may write data to the semiconductor package 2003 or read data from the semiconductor package 2003, and may improve the operation speed of the data storage system 2000.

The DRAM 2004 may be or include a buffer memory for reducing a speed difference between the semiconductor package 2003, which is a data storage space, and an external host. The DRAM 2004 included in the data storage system 2000 may also operate as a type of cache memory, and may provide a space for temporarily storing data in a control operation on the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the respective semiconductor chips 2200, a connection structure 2400 electrically connecting the semiconductor chips 2200 and the package substrate 2100, and a molding layer 2500 covering the semiconductor chips 2200 and the connection structure 2400, on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 15. Each of the semiconductor chips 2200 may include stack structures 3210 and channel structures 3220. Each of the semiconductor chips 2200 may include the semiconductor device according to the some example embodiments described above with reference to FIGS. 1 to 13.

In some example embodiments, the connection structure 2400 may be a bonding wiring electrically connecting the input/output pad 2210 and the package upper pads 2130. Accordingly, in each of the first and second semiconductor packages 2003a and 2003b, the semiconductor chips 2200 may be electrically connected to each other by a bonding wiring method, and may be electrically connected to the package upper pads 2130 of the package substrate 2100. According to some example embodiments, in each of the first and second semiconductor packages 2003a and 2003b, the semiconductor chips 2200 may also be electrically connected to each other by a connection structure including a through-silicon via (TSV), instead of the bonding wiring type connection structure 2400.

In some example embodiments, the controller 2002 and the semiconductor chips 2200 may also be included in a single package. In an example embodiment, the controller 2002 and the semiconductor chips 2200 may be mounted on a separate interposer substrate different from the main substrate 2001, and the controller 2002 and the semiconductor chips 2200 may be connected to each other by wiring formed on the interposer substrate.

Figure 17:
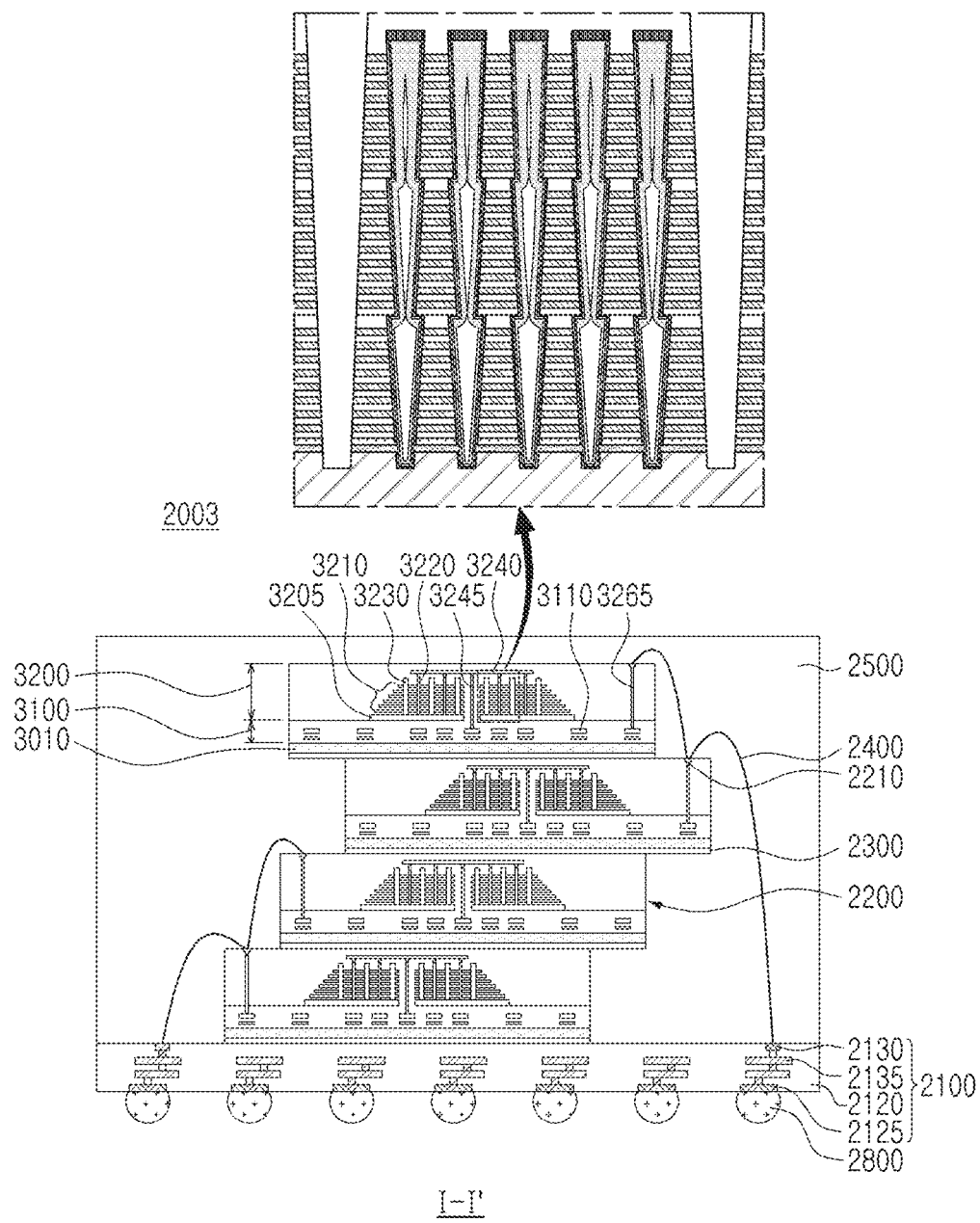
FIG. 17 is a schematic cross-sectional view of a semiconductor package according to an example embodiment.

FIG. 17 is a schematic cross-sectional view of a semiconductor package according to an example embodiment. FIG. 17 illustrates an example embodiment of the semiconductor package 2003 of FIG. 16, and conceptually illustrates a region taken along line I-F of the semiconductor package 2003 of FIG. 16.

Referring to FIG. 17, in the semiconductor package 2003, the package substrate 2100 may be a printed circuit board. The package substrate 2100 may include a package substrate body portion 2120, package upper pads 2130 disposed on the upper surface of the package substrate body part 2120, lower pads 2125 disposed on the lower surface of the package substrate body portion 2120 or exposed through the lower surface thereof, and internal wirings 2135 electrically connecting the upper pads 2130 and the lower pads 2125 inside of the package substrate body portion 2120. The upper pads 2130 may be electrically connected to the connection structures 2400. The lower pads 2125 may be connected to the wiring patterns 2005 of the main substrate 2010 of the electronic system 2000 as illustrated in FIG. 16, through the conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may include a peripheral circuit area including peripheral wirings 3110. The second structure 3200 may include a common source line 3205, a stack structure 3210 on the common source line 3205, channel structures 3220 and a separation structure 3230 penetrating through the stack structure 3210, bit lines 3240 electrically connected to the channel structures 3220, and gate connection wirings 3235 electrically connected to the word lines (see WL of FIG. 15) of the stack structure 3210. Each of the first structure 3100, the second structure 3200 and the semiconductor chips 2200 may include an upper stack structure STU, a lower stack structure STL, an upper channel structure CHU penetrating through the upper stack structure STU, and a lower channel structure CHL, as illustrated in the enlarged view. Each of the lower channel structure CHL and the upper channel structure CHU may include a channel layer 140, a channel insulating layer 150 on the channel layer 140, and a slit SL disposed inside of the channel insulating layer 150. The thickness of the channel insulating layer 150 may be increased toward the top. The slit SL may include an upper slit SLU and a lower slit SLL, and the width of the upper slit SLU may be less than the width of the lower slit SLL.

Each of the semiconductor chips 2200 may include a through wiring 3245 that is electrically connected to the peripheral wirings 3110 of the first structure 3100 and extends into the second structure 3200. The through wiring 3245 may penetrate through the stack structure 3210, and may be further disposed outside of the stack structure 3210. Each of the semiconductor chips 2200 may further include an input/output connection wiring 3265 which is electrically connected to the peripheral wirings 3110 of the first structure 3100 and extends into the second structure 3200, and an input/output pad (see 2210 in FIG. 16) electrically connected to the input/output connection wiring 3265.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As set forth above, according to some example embodiments, a semiconductor device in which the volume of a channel insulating layer inside of a channel structure is formed to be relatively reduced toward the bottom, and a data storage system including the same may be provided, thereby preventing or reducing the likelihood of distortion of the semiconductor device due to tensile stress increasing toward the bottom.

While some example embodiments have been illustrated and described above, it will be apparent to those of ordinary skill in the art that modifications and variations could be made without departing from the scope of example embodiments as defined by the appended claims.

What is claimed is:

1. A semiconductor device comprising:
a substrate;
a lower stack structure on the substrate, and including lower gate electrodes stacked apart from each other;
an upper stack structure on the lower stack structure and including upper gate electrodes stacked apart from each other;
a lower channel structure penetrating through the lower stack structure, and including a lower channel layer and a lower channel insulating layer on the lower channel layer, the lower channel insulating layer surrounding a lower slit; and
an upper channel structure penetrating through the upper stack structure and including an upper channel layer and an upper channel insulating layer on the upper channel layer, the upper channel insulating layer surrounding an upper slit,
wherein the lower channel structure includes a first channel structure, a second channel structure on the first channel structure, and a bent structure between the first channel structure and the second channel structure, a bend in the bent structure corresponding to a difference in widths between the first and second channel structures,
a width of a lower portion of the upper channel structure is less than a width of an upper portion of the lower channel structure, and
a maximum width of the lower slit is greater than a maximum width of the upper slit.

2. The semiconductor device of claim 1, wherein the lower channel insulating layer includes a first lower channel insulating layer inside of the first channel structure, and a second lower channel insulating layer inside of the second channel structure,
the first lower channel insulating layer surrounds a first lower slit of the lower slit, and the second lower channel insulating layer surrounds a second lower slit of the lower slit, and
a width of the first lower slit is greater than a width of the second lower slit.

3. The semiconductor device of claim 2, wherein a thickness of the second lower channel insulating layer is greater than a thickness of the first lower channel insulating layer.

4. The semiconductor device of claim 2, wherein the first lower channel insulating layer surrounds a lower portion, an upper portion and a side surface of the first lower slit.

5. The semiconductor device of claim 1, wherein the upper channel insulating layer includes a first upper channel insulating layer on the upper channel layer, and a second upper channel insulating layer on the first upper channel insulating layer.

6. The semiconductor device of claim 5, wherein the first upper channel insulating layer includes a different material from the materials included in the second upper channel insulating layer.

7. The semiconductor device of claim 5, wherein the first upper channel insulating layer includes a same material from the materials of the second upper channel insulating layer.

8. The semiconductor device of claim 1, wherein a thickness of the upper channel insulating layer is greater than a thickness of the lower channel insulating layer.

9. The semiconductor device of claim 1, wherein a volume of the lower slit is greater than a volume of the upper slit.

10. The semiconductor device of claim 1, wherein the lower slit extends from an interior of the first channel structure to an interior of the second channel structure, and connects to the first channel structure and the second channel structure, and is arranged between the first channel structure and the second channel structure.

11. The semiconductor device of claim 1, wherein a first width of the upper channel structure is greater than a second width of the second channel structure.

12. The semiconductor device of claim 1, wherein a first width of the upper channel structure is less than a second width of the second channel structure.

13. The semiconductor device of claim 1, wherein a first width of the upper channel structure is substantially the same as a second width of the second channel structure.

14. The semiconductor device of claim 1, wherein an upper portion, a lower portion, and a side surface of the upper slit contact the upper channel insulating layer.

15. The semiconductor device of claim 1, wherein the lower channel structure includes a lower gate dielectric layer between the lower gate electrodes and the lower channel layer, and
the upper channel structure includes an upper gate dielectric layer between the upper gate electrodes and the upper channel layer.

16. A semiconductor device comprising:
a substrate;
a lower stack structure on the substrate and including lower gate electrodes stacked apart from each other;
an upper stack structure on the lower stack structure and including upper gate electrodes stacked apart from each other;
a lower channel structure penetrating through the lower stack structure and including a lower channel layer, and a lower channel insulating layer on the lower channel layer, the lower channel insulating layer surrounding a lower slit; and
an upper channel structure penetrating through the upper stack structure and including an upper channel layer, and an upper channel insulating layer disposed on the upper channel layer, the upper channel insulating layer surrounding an upper slit,
wherein a maximum width of the lower slit is greater than a maximum width of the upper slit, and
wherein a maximum thickness of the upper channel insulating layer is greater than a maximum thickness of the lower channel insulating layer.

17. The semiconductor device of claim 16, wherein the lower slit includes a first lower slit adjacent to the substrate and a second lower slit spaced apart from the first lower slit in a direction that is perpendicular to an upper surface of the substrate, and
a width of the first lower slit is greater than a width of the second lower slit.

18. The semiconductor device of claim 16, wherein the lower slit includes at least one bent portion having a bend associated with a difference in widths between an upper portion of the lower slit and a lower portion of the lower slit.

19. A data storage system comprising:
a semiconductor storage device including a base substrate; active or passive circuits on the base substrate; a substrate on the active or passive circuits; a lower stack structure on the substrate and including lower gate electrodes stacked apart from each other; an upper stack structure on the lower stack structure and including upper gate electrodes stacked apart from each other; a lower channel structure penetrating through the lower stack structure and including a lower channel layer and a lower channel insulating layer on the lower channel layer, the lower channel insulating layer surrounding a lower slit; and an upper channel structure penetrating through the upper stack structure and including an upper channel layer and an upper channel insulating layer disposed on the upper channel layer, the upper channel insulating layer surrounding an upper slit, the semiconductor storage device including an input/output pad electrically connected to the at least one of the active or passive circuits; and
a controller circuitry electrically connected to the semiconductor storage device through the input/output pad and configured to control the semiconductor storage device,
wherein a maximum width of the lower slit is greater than a maximum width of the upper slit, and
a thickness of the upper channel insulating layer is greater than a thickness of the lower channel insulating layer.

20. The data storage system of claim 19, wherein the lower channel structure includes a first channel structure, a second channel structure on the first channel structure, and a bent portion between the first channel structure and the second channel structure, the bent portion including a bend associated with a difference in widths between the first and second channel structures.

* * * * *